US008289722B2

(12) United States Patent
Furubo

(10) Patent No.: US 8,289,722 B2
(45) Date of Patent: Oct. 16, 2012

(54) ELECTRONIC APPARATUS

(75) Inventor: Takayuki Furubo, Chiba (JP)

(73) Assignee: Sony Computer Entertainment Inc., Tokyo (JP)

( * ) Notice: Subject to any disclaimer, the term of this patent is extended or adjusted under 35 U.S.C. 154(b) by 259 days.

(21) Appl. No.: 12/732,741

(22) Filed: Mar. 26, 2010

(65) Prior Publication Data
US 2010/0254102 A1 Oct. 7, 2010

(30) Foreign Application Priority Data

Apr. 2, 2009 (JP) ................................ 2009-090568
Apr. 2, 2009 (JP) ................................ 2009-090569

(51) Int. Cl.
H05K 5/00 (2006.01)
H05K 7/00 (2006.01)
(52) U.S. Cl. .................................. 361/752; 361/679.01
(58) Field of Classification Search .................... None
See application file for complete search history.

(56) References Cited

U.S. PATENT DOCUMENTS

| 6,906,926 | B2* | 6/2005 | Shimizu ..................... 361/726 |
| 6,929,547 | B2* | 8/2005 | Komata ....................... 463/36 |
| 7,052,798 | B2* | 5/2006 | Kaelin et al. .................. 429/96 |
| 7,314,413 | B2* | 1/2008 | Ogata et al. .................. 463/37 |
| 7,377,851 | B2* | 5/2008 | Goto et al. ................... 463/37 |
| 2002/0179807 | A1* | 12/2002 | Jitsukawa .................. 248/638 |
| 2005/0073806 | A1* | 4/2005 | Oesch et al. ................ 361/679 |
| 2005/0143029 | A1* | 6/2005 | Sasaki et al. ................ 455/128 |
| 2005/0176506 | A1* | 8/2005 | Goto et al. .................. 463/37 |
| 2008/0205022 | A1* | 8/2008 | Gilliland et al. ............. 361/809 |
| 2008/0310082 | A1* | 12/2008 | Kutaragi et al. ............ 361/679 |
| 2009/0040737 | A1* | 2/2009 | Shimura et al. ............. 361/752 |

FOREIGN PATENT DOCUMENTS

| JP | 08-036871 A | 2/1996 |
| JP | 2008-103671 A | 5/2008 |
| JP | 2008103671 A * | 5/2008 |

* cited by examiner

Primary Examiner — Lisa Lea Edmonds
Assistant Examiner — Xanthia C Cunningham
(74) Attorney, Agent, or Firm — Matthew B. Dernier, Esq.; Gibson & Dernier LLP

(57) ABSTRACT

In order to provide an electronic apparatus capable of smooth operation of a press button, an electronic apparatus includes: an outer panel having a hole in which a press button is fitted and a circuit board placed on a back side of the outer panel; a stopper restricted from moving in the thickness direction of the outer panel is formed between the press button and the circuit board; the stopper is brought into contact with the flange portion formed on an edge of the press button when the press button has moved in the thickness direction of the outer panel.

10 Claims, 17 Drawing Sheets

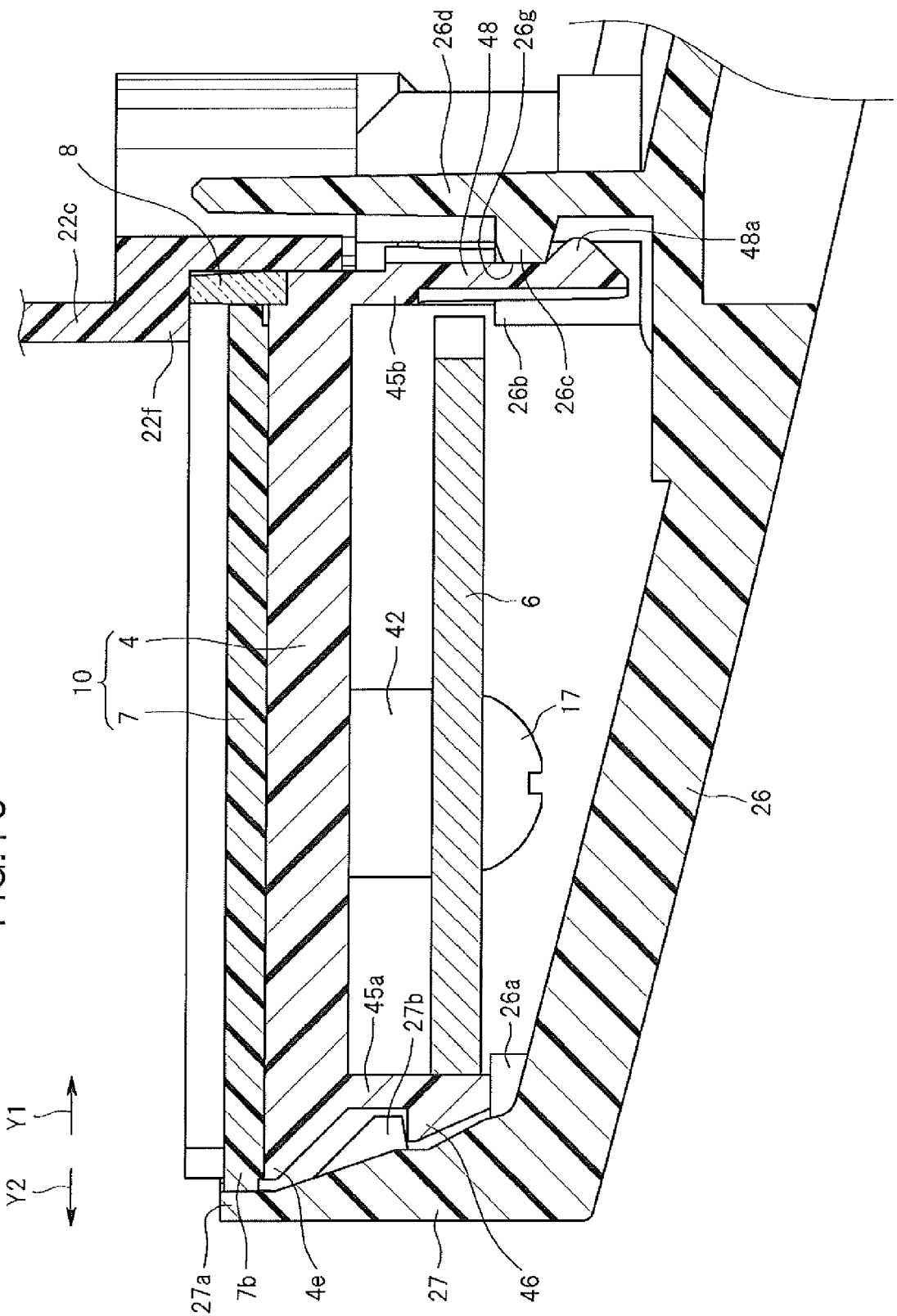

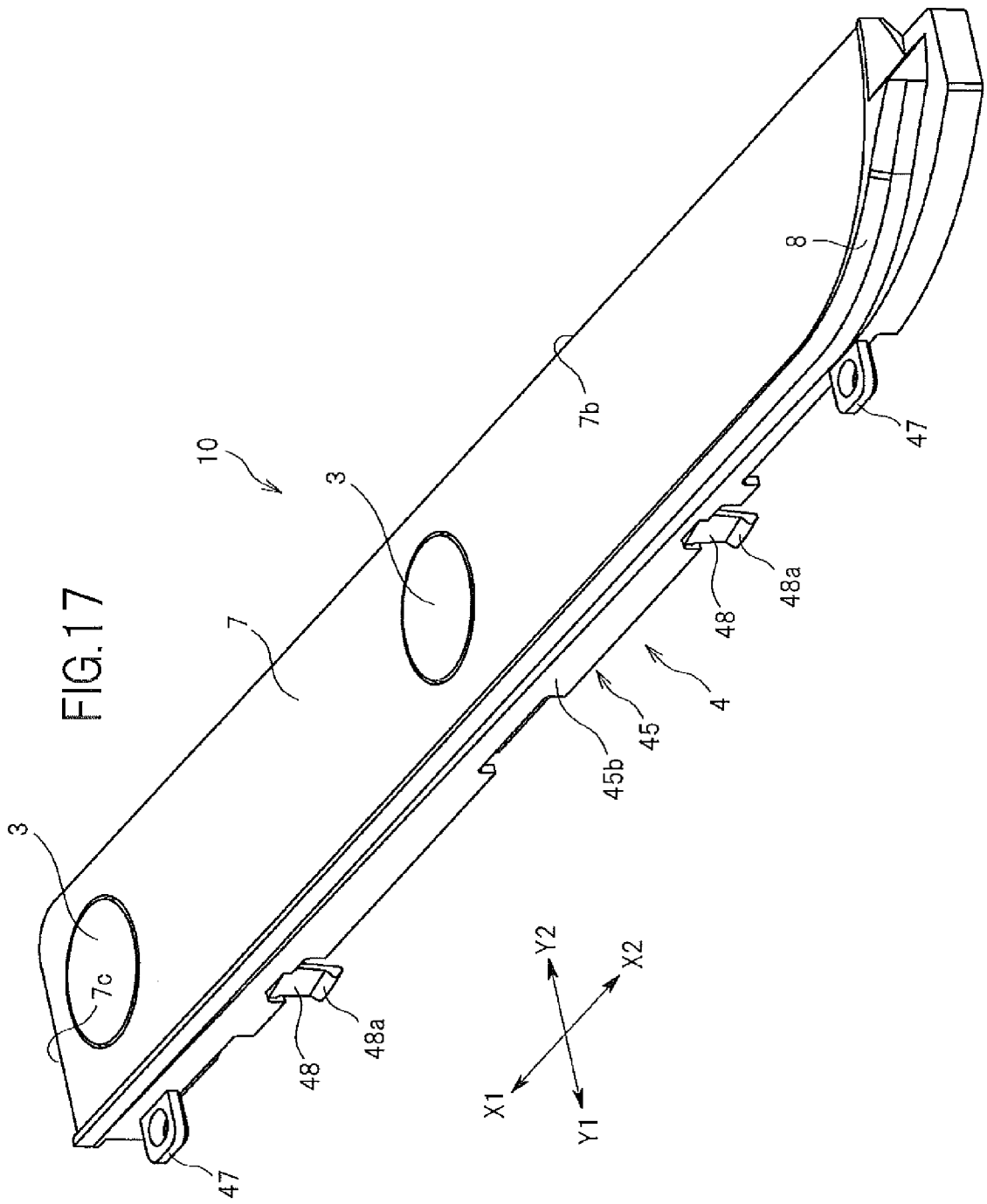

ELECTRONIC APPARATUS

CROSS-REFERENCE TO RELATED APPLICATION

The present application claims priorities from Japanese application JP 2009-090568 filed on Apr. 2, 2009, and Japanese application JP 2009-090569 filed on Apr. 2, 2009, the contents of which are hereby incorporated by reference into this application.

BACKGROUND OF THE INVENTION

1. Field of the Invention

The present invention relates to an electronic apparatus, such as a game device, an audio visual device, a personal computer, and so forth.

2. Description of the Related Art

Conventionally, an electronic apparatus, such as a game device, an audio visual device, a personal computer, and so forth, is available. Some of the electronic apparatuses (e.g., JP H8-36871 A) have a press button, such as a power button, an eject button for ejecting a storage media, and so forth, and some press buttons are arranged inside a hole formed on a panel forming an outer surface of the electronic apparatus so as to move in the thickness direction of the panel. When the press button is pressed and thereby moved in the thickness direction, a contact formed on a circuit board disposed on the back side of the panel is pressed onto the press button, whereby electrical connection is made.

Further, a conventional electronic apparatus (e.g., JP 2008-103671 A) comprises a housing including a lower housing formed opening upward and an upper housing disposed on, while covering, the lower housing and assembled to the lower housing. The electronic apparatus disclosed in JP 2008-103671 A includes a part formed horizontally on the front part of the upper housing (hereinafter referred to as a front board) and facing the lower housing in the up-and-down direction. The upper and lower housings are fixed to each other such that the front edge of the front board is placed on the upper edge of the lower housing.

SUMMARY OF THE INVENTION

An electronic apparatus including a press button as disclosed in JP H8-36871 A mentioned above has the following problem. In such an electronic apparatus, for the purpose of improving its appearance, the button is sometimes desired to be arranged such that the surface of the button is positioned on substantially the same plane as the surface of the panel and also the panel is desired to be formed thinner so that expensive material having superior appearance can be used for the panel. With such an electronic apparatus, however, when the press button is pressed, the button is apt to sink more than a depth defined by the thickness of the panel. With the press button sinking more than the depth defined by the thickness of the panel, the press button may be caught by the edge of the hole on the panel, which may hinder smooth operation of the press button.

Further, an electronic apparatus including a housing, such as the housing disclosed in JP 2008-103671 A mentioned above, has the following problem. A member constituting a housing, such as an upper housing, a lower housing, or the like, generally has a tolerance. Therefore, in the structure, as disclosed in JP 2008-103671 A, in which the front edge of the front board is placed on the upper edge of the lower housing, precise matching in position of the front edge of the front board and the upper edge of the lower housing is difficult to attain due to the tolerance thereof. With the positions of the edges not precisely matched, a finger of a user trying to pick up an electronic apparatus is sometimes caught by the front edge of the front board, as a result of which an undesirable load is applied to the position at which the upper housing and lower housing are fixed to each other. With respect to this problem, there may be considered a structure in which the front board is arranged such that the front edge thereof is located inside the upper edge of the lower housing. However, locating the front board inside the lower housing and then merely fixing the upper housing including the front board to the lower housing will cause a gap between the front edge of the front board and the lower housing, which may possibly deteriorate the external appearance of the electronic apparatus.

In view of the above, a first object of the present invention is to provide an electronic apparatus capable of smooth operation of a press button even when the button is arranged such that the button surface is positioned on substantially the same surface as the panel surface, and the panel is formed thin.

A second object of the present invention is to provide an electronic apparatus capable of preventing a finger of a user or the like from catching on an edge of a front board, and preventing a gap from being caused between the edge of the front board and the lower housing.

In order to achieve the above described first object, an electronic apparatus according to one aspect of the present invention includes: a press button; an outer panel forming an outer surface of the electronic apparatus and having a hole formed therein, the press button being fitted inside the hole; and a circuit board disposed on a back side of the outer panel. The press button is provided capable of moving in a thickness direction of the outer panel inside the hole formed on the outer panel. And the electronic apparatus further includes a stopper formed between the press button and the circuit board, the stopper being restricted from moving in the thickness direction and brought into contact with an edge of the press button when the press button has moved in the thickness direction.

According to the present invention, it is possible to prevent the press button from sinking more than the depth defined by the thickness of the outer panel. As a result, the press button can be prevented from being caught by the outer panel, which allows smooth operation of the press button.

In an embodiment of the present invention, the electronic apparatus may further include an middle member disposed between the outer panel and the circuit board, the middle member being restricted from moving in the thickness direction of the outer panel and having the stopper formed therein. According to this embodiment, a stopper can be readily formed in the electronic apparatus. Further in this embodiment, the outer panel and the circuit board may be attached to the middle member. With the above structure, the outer panel and the circuit board can be handled as a single component in a manufacturing process of electronic apparatuses. Further, in this embodiment, the middle member may have a hole formed therein at a position below the press button, and the stopper may be formed on the edge of the hole, extending in the circumferential direction of the hole. With the above structure, the stopper is brought into contact with the press button in a large area thereof, so that the press button can be appropriately prevented from sinking more than the depth defined by the thickness of the outer panel.

In another embodiment of the present invention, the electronic apparatus may further include an elastic member disposed between the circuit board and the press button, and pressing the press button onto the outer panel, wherein the elastic member and the press button are provided capable of being relatively displaced. In this embodiment, the position of the press button on the outer panel can be defined by the hole formed on the outer panel.

In order to achieve the above described second object, an electronic apparatus according to another aspect of the present invention includes: an lower housing formed opening upward; and an upper housing arranged covering the lower housing on the upper side thereof and assembled to the lower housing, wherein the upper housing includes a front board in a front portion thereof, the front board being defined as a board like member arranged facing the lower housing in an up-and-down direction. The front board is arranged such that an edge thereof is located along an upper edge of the lower housing, the edge of the front board being located inside the upper edge of the lower housing. The electronic apparatus further includes a pressing portion pressing the front board toward the upper edge of the lower housing.

According to the present invention, it is possible to prevent a finger of a user or the like from catching on the front board and also to prevent a gap from being caused between the front board of the upper housing and the lower housing.

In one embodiment of the present invention, the upper housing may further include a housing main body formed covering the lower housing on the upper side thereof and thereby closing the lower housing on the upper side thereof, and the front board and the housing main body may be separately formed. According to this embodiment, the front board is pressed toward the edge of the lower housing by the pressing portion, whereas the housing main body can be attached to the lower housing such that the edge of the housing main body is placed on the upper edge of the lower housing.

In another embodiment of the present invention, the pressing portion may be formed in the lower housing. With the above structure, it is possible to suppress displacement in relative position between the upper edge of the lower housing and the pressing portion. As a result, it is possible to reliably prevent a gap from being caused between the upper edge of the lower housing and the edge of the front board.

In still another embodiment of the present invention, the front board may be disposed inside a corner of the upper edge of the lower housing, and the direction in which the pressing portion presses the front board may incline toward the corner. With the above structure, it is possible to prevent a gap from being caused between the corner of the upper edge of the lower housing and the edge of the front board.

In yet another embodiment of the present invention, the front board is arranged such that a front edge of the front board is located along the upper edge of the lower housing, and has a wall formed on a rear edge of the front board. The housing main body may have a front wall formed on a front portion thereof and placed on the wall formed in the front board, and the front wall of the housing main body may be arranged such that a lower edge thereof is located further forward than the wall of the front board. With the above structure, the gap between the lower edge of the front wall of the housing main body and the front wall does not appear outstanding.

BRIEF DESCRIPTION OF THE DRAWINGS

FIG. 16 is a cross sectional view of a lower housing having the front board attached thereto, with a cross section shown being identical to that shown in FIG. 15;
and
FIG. 17 is a perspective view showing the front board viewed diagonally rearward.

DESCRIPTION OF THE PREFERRED EMBODIMENTS

Figure 1:
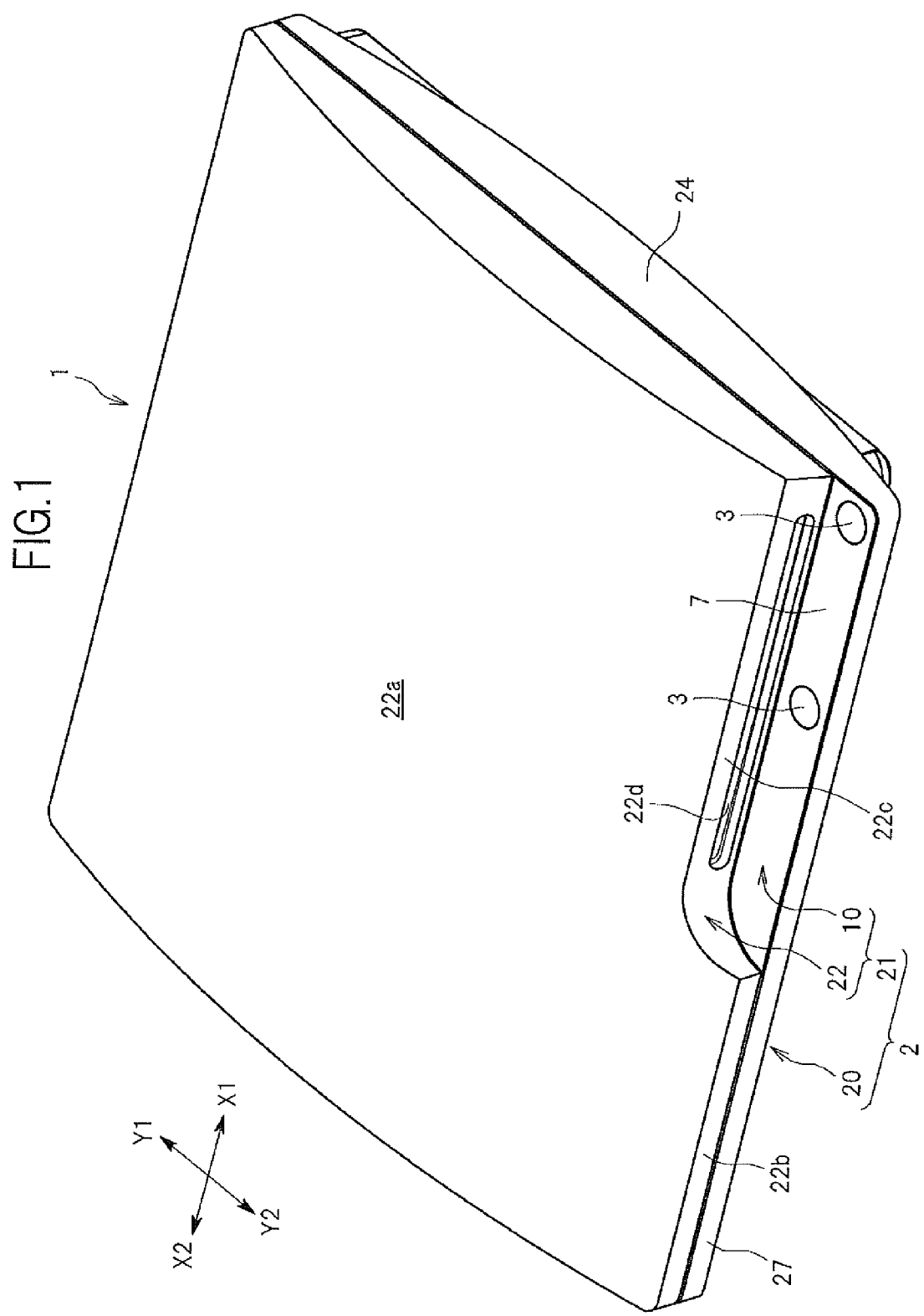
FIG. 1 is a perspective view of an electronic apparatus according to an embodiment of the present invention.
Figure 2:
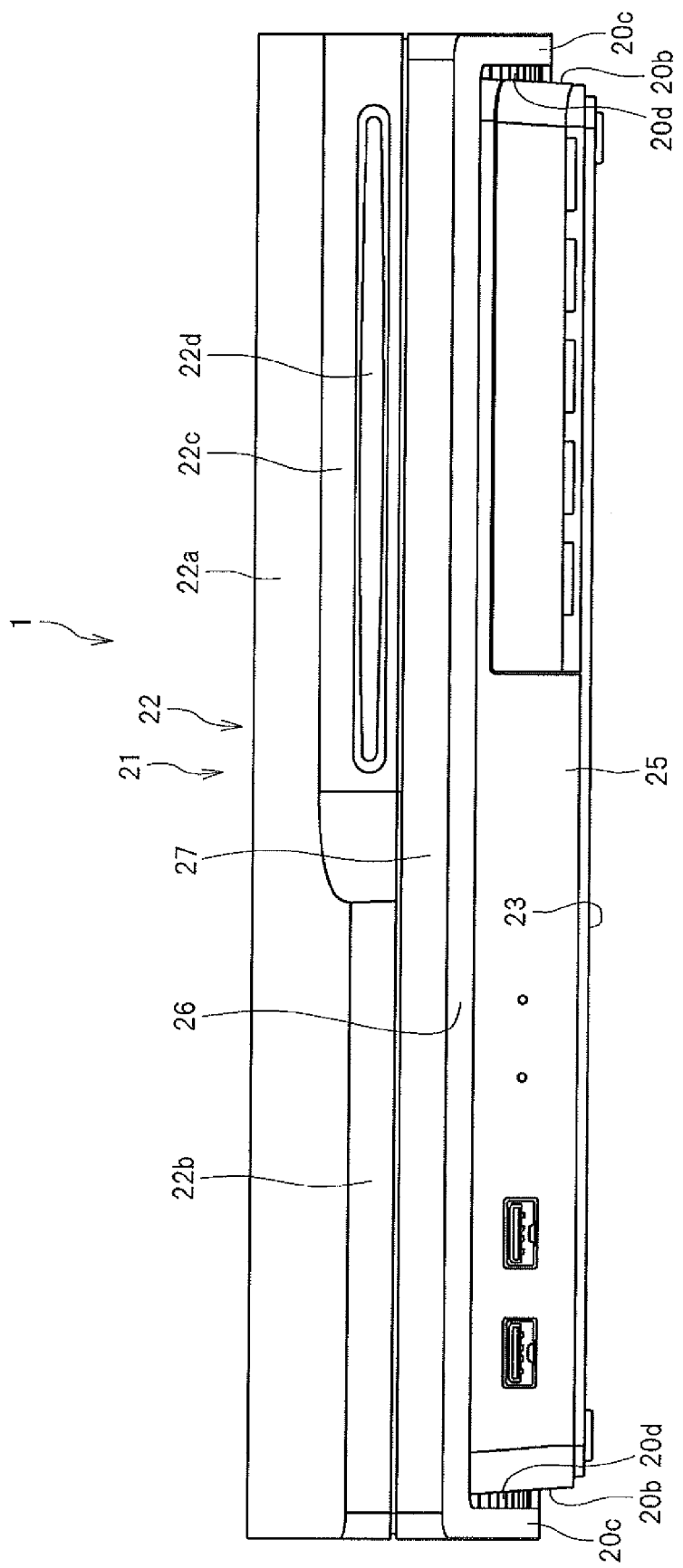
FIG. 2 is a front view of the electronic apparatus.
Figure 3:
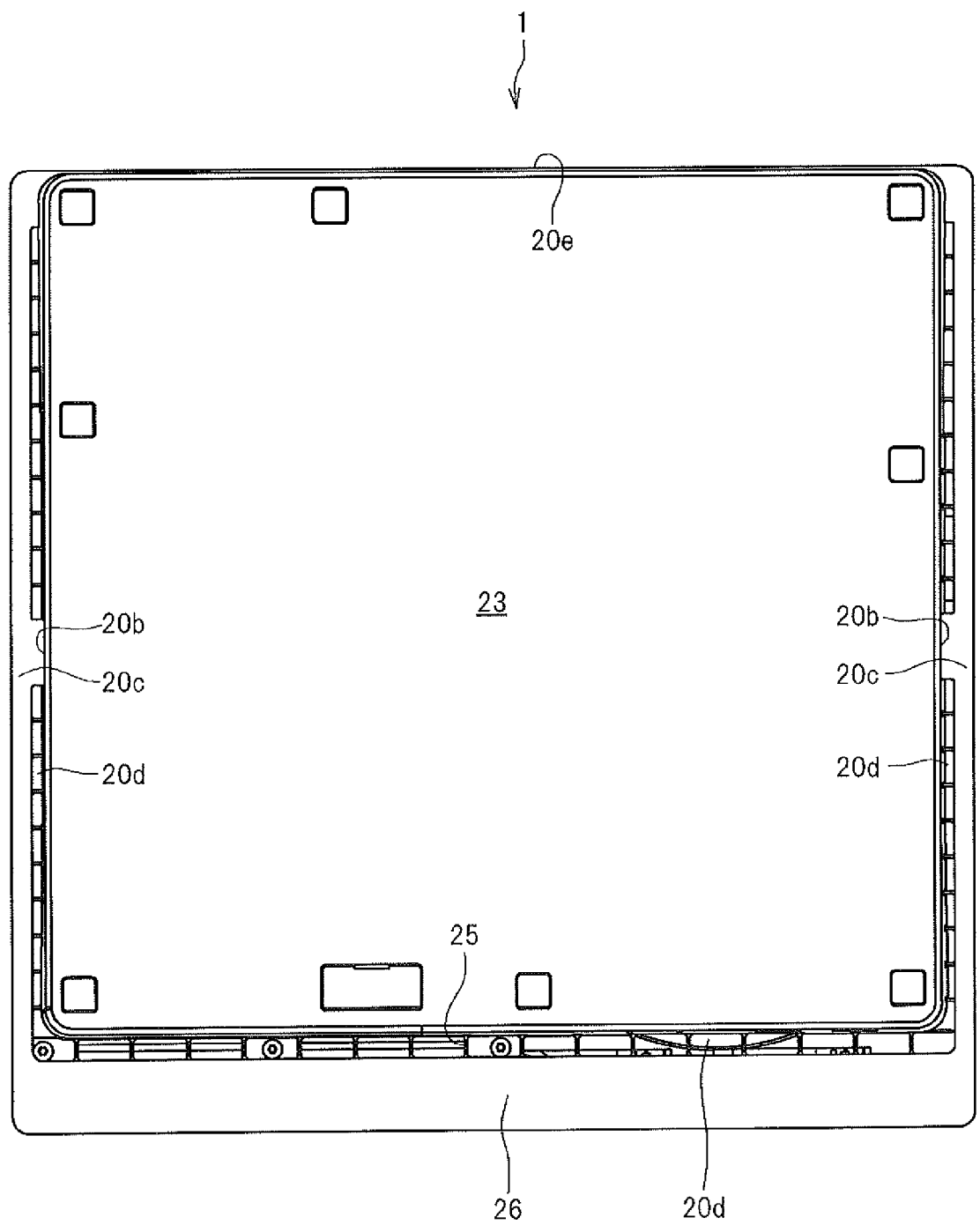
FIG. 3 is a bottom view of the electronic apparatus.
Figure 4:
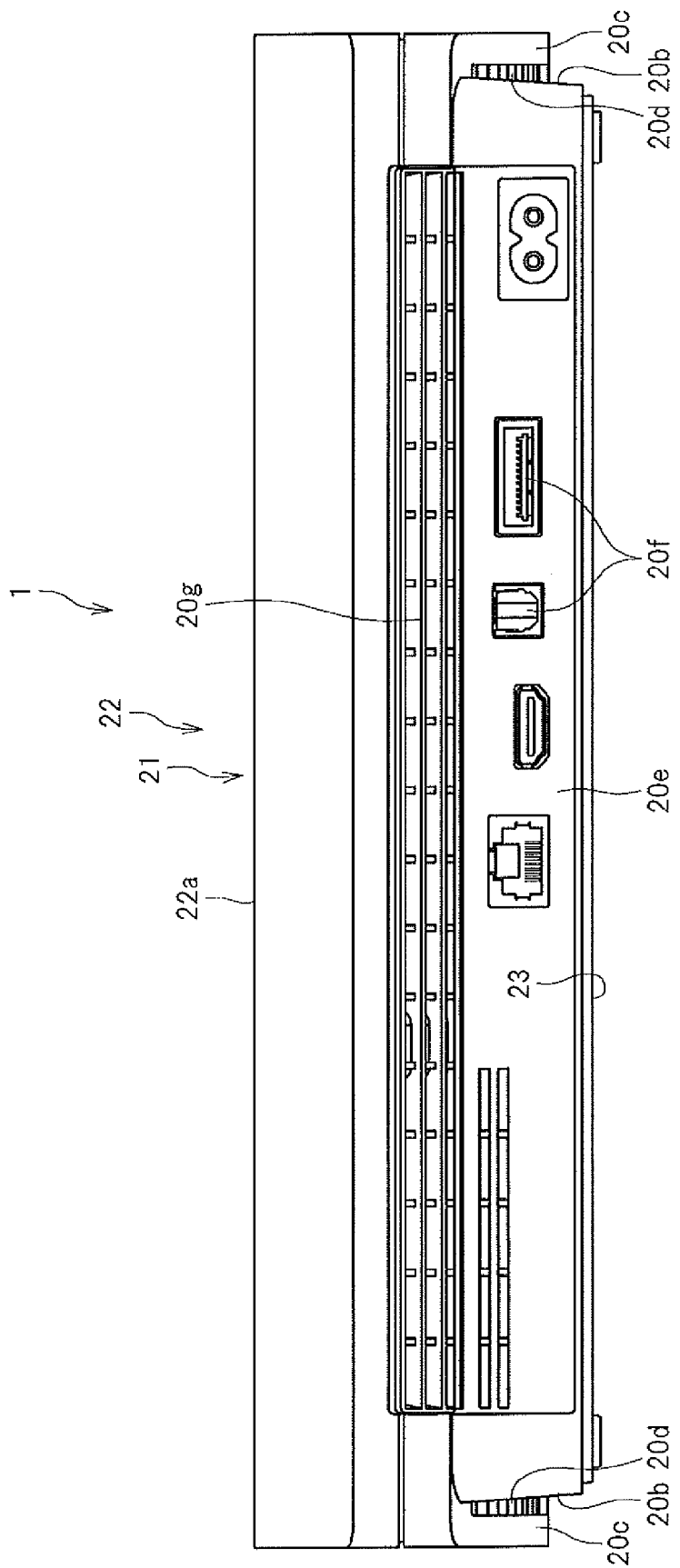
FIG. 4 is a rear elevation view of the electronic apparatus.
Figure 5:
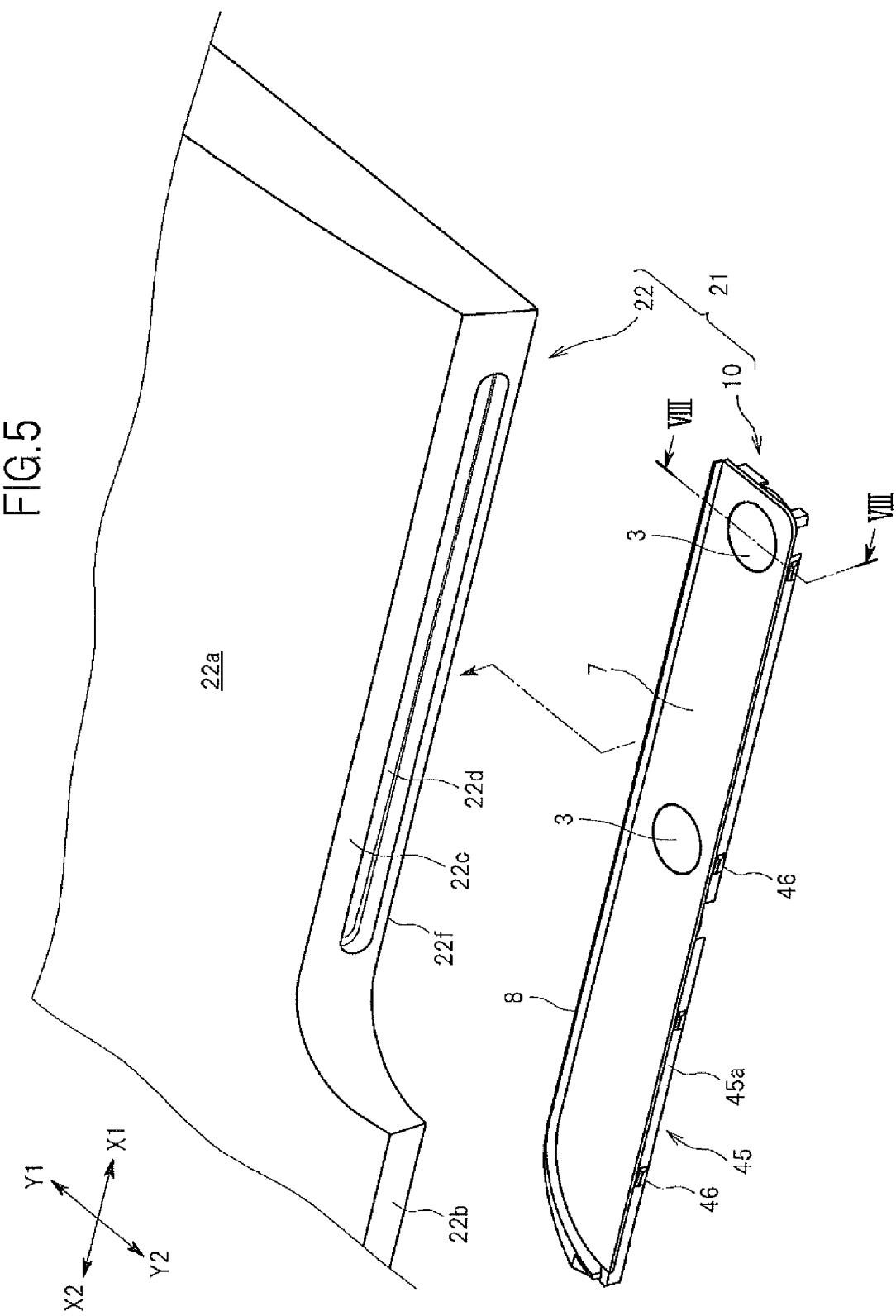
FIG. 5 is an exploded perspective view of an upper housing and a front board constituting the electronic apparatus.
Figure 6:
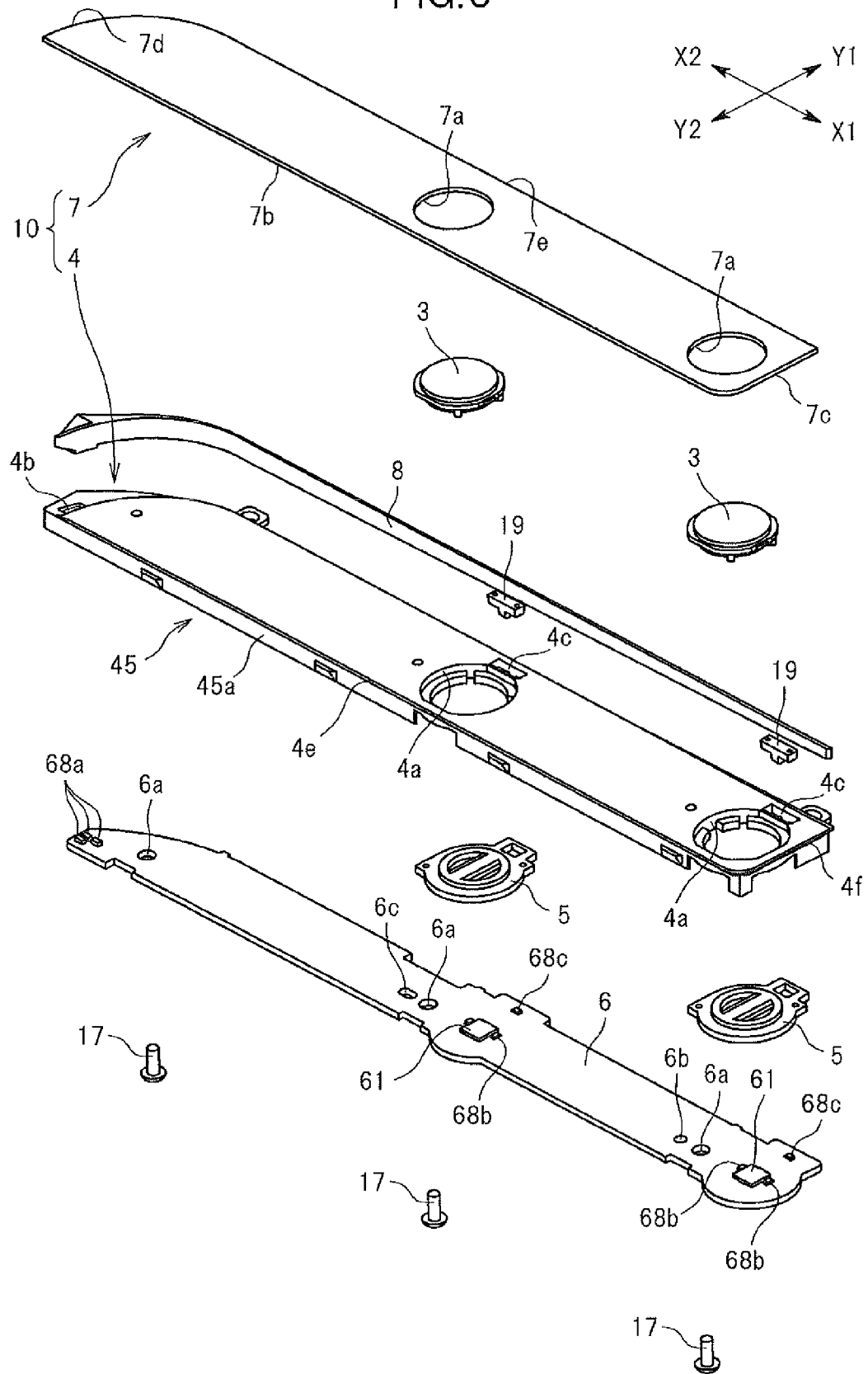
FIG. 6 is an exploded perspective view of the front board.
Figure 7:
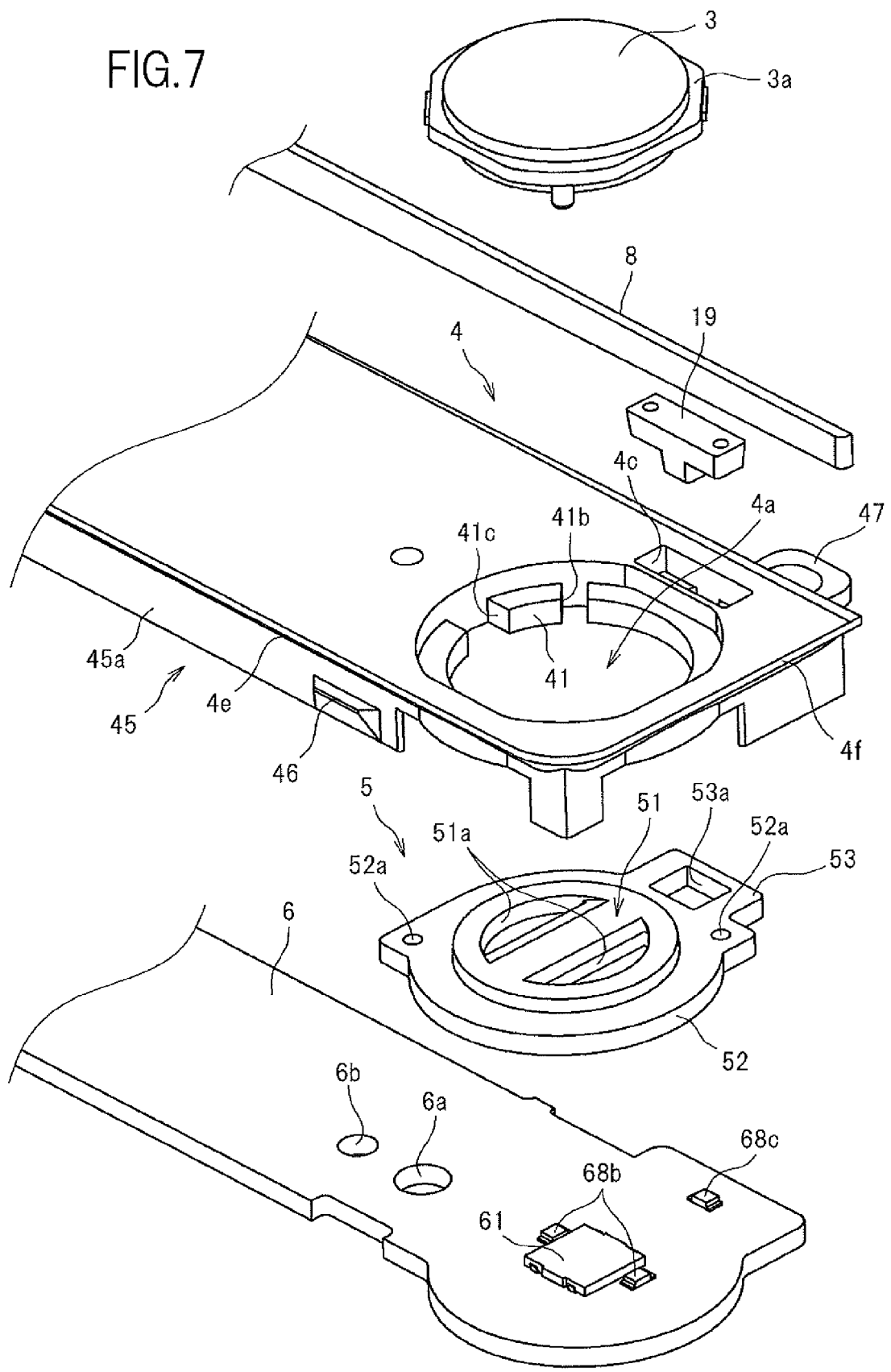
FIG. 7 is an enlarged view of FIG. 6.
Figure 8:
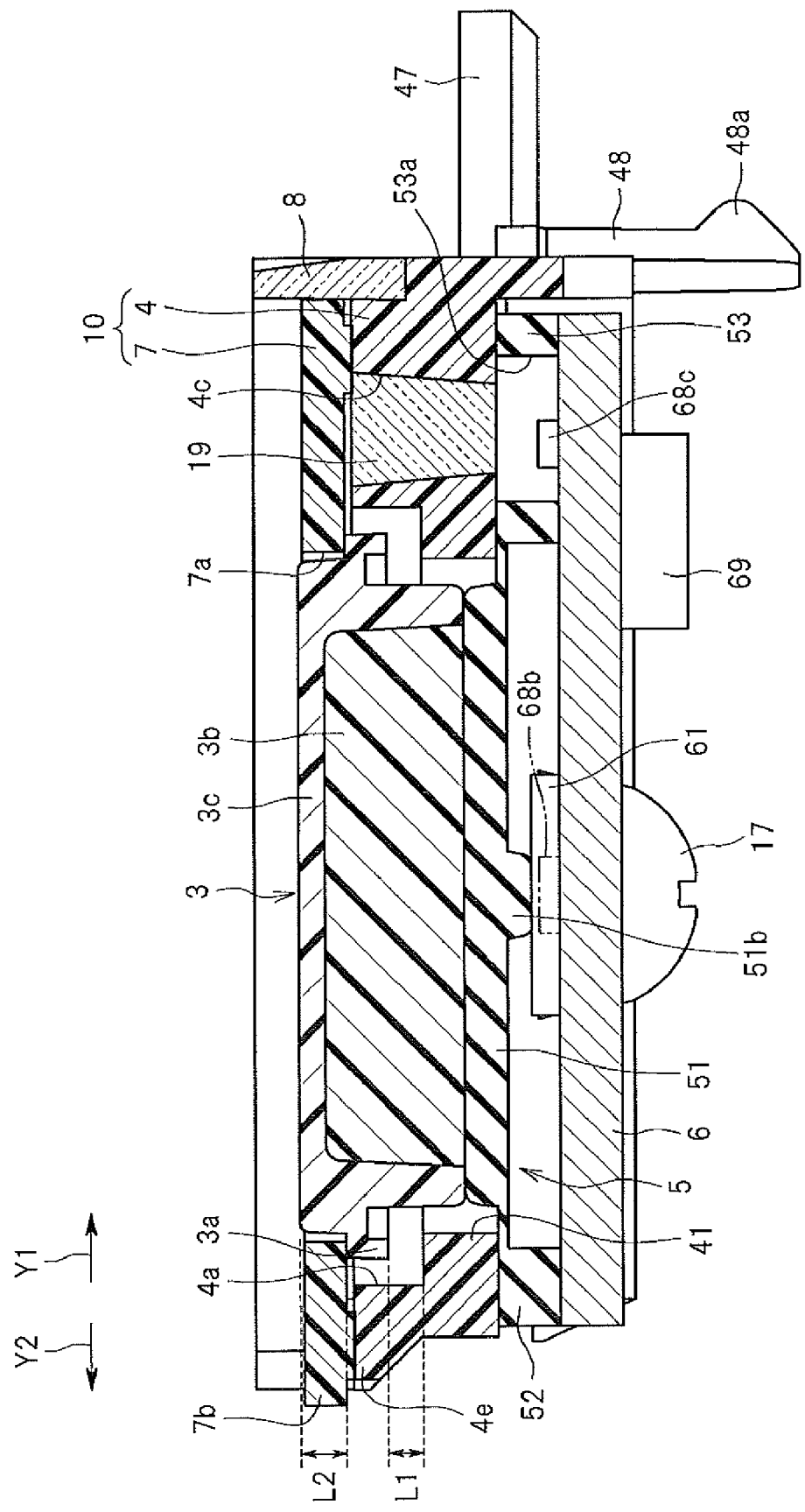
FIG. 8 is a cross sectional view along the line VIII-VIII in FIG. 5.
Figure 9:
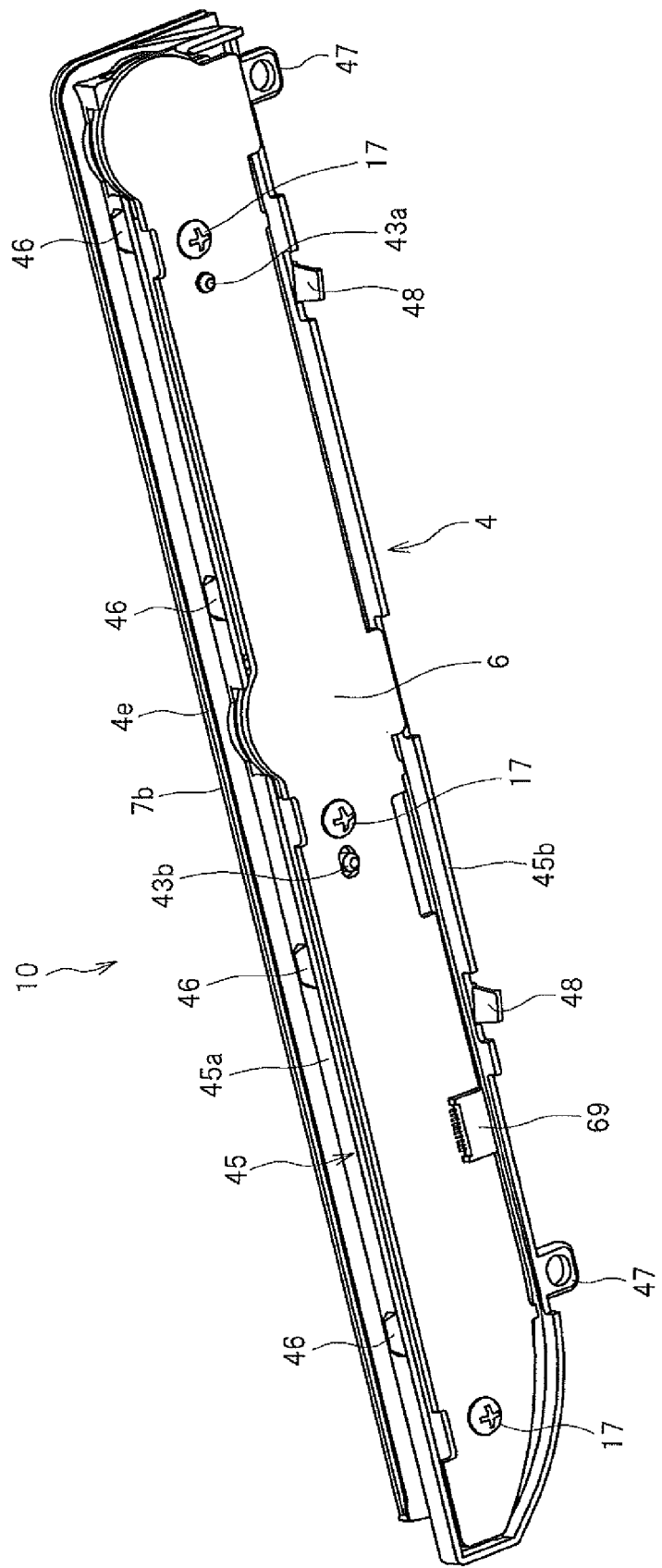
FIG. 9 is a perspective view of the front board viewed diagonally from below.
Figure 10:
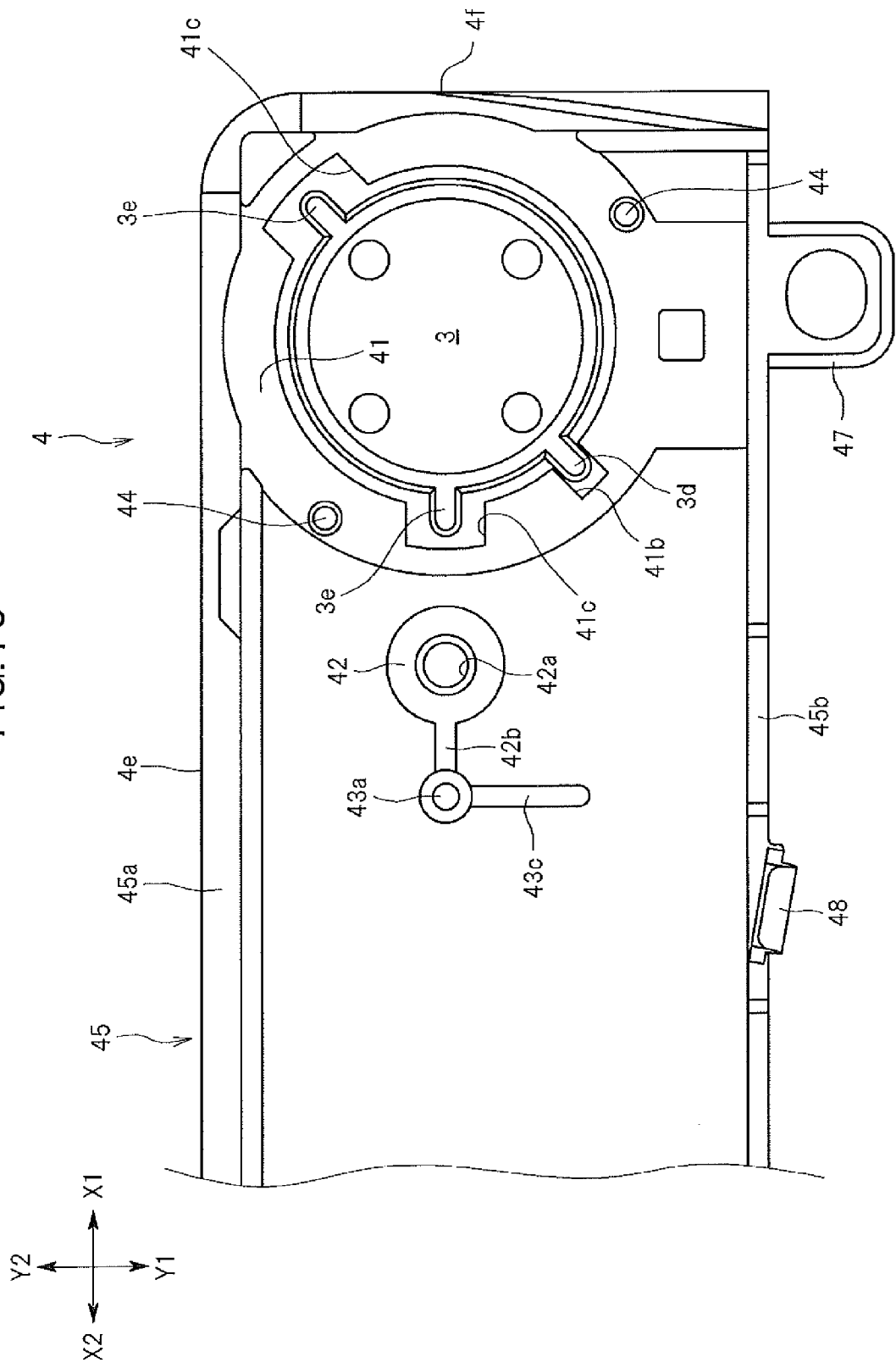
FIG. 10 is a bottom view of a press button and a base board constituting the front board.

In the following, one embodiment of the present invention will be described with reference to the accompanying drawings. FIG. 1 is a perspective view of an electronic apparatus 1 which is an example of an embodiment of the present invention; FIG. 2 is a front view of the electronic apparatus 1; FIG. 3 is a bottom view of the electronic apparatus 1; FIG. 4 is a rear elevation view of the electronic apparatus 1. FIG. 5 is an exploded perspective view of a front board 10 and a housing main body 22 of an upper housing 21 equipped to the electronic apparatus 1. FIG. 6 is an exploded perspective view of the front board 10. FIG. 7 is an enlarged view of FIG. 6. FIG. 8 is a cross sectional view along the line VIII-VIII in FIG. 5. FIG. 9 is a perspective view of the front board 10 viewed diagonally from below. FIG. 10 is a bottom view of a press button 3 and a base board 4.

As shown in FIG. 1, 2, or 5, the electronic apparatus 1 includes a housing 2 forming the outer surface thereof. The electronic apparatus 1 is, e.g., a game device or an audio visual device, and has a device for reading a portable storage medium, a circuit board, and so forth, arranged inside the housing 2. The housing 2 has a lower housing 20 having a substantially box shape formed opening upward and an upper housing 21 having a substantially box shape formed opening downward. The upper housing 21 is arranged covering the lower housing 20 on the upper side thereof, and assembled to the lower housing 20.

The upper housing 21 has a front board 10 formed on the front portion thereof, the front board 10 being formed facing the lower housing 20 in the up-and-down direction. The upper housing 21 further has a housing main body 22 arranged covering the lower housing 20. The housing main body 22 is arranged such that the lower edge thereof is placed on the upper edge of the lower housing 20, thereby closing the lower housing 20 on the upper side thereof. The upper side of the lower housing 20 formed opening upward is closed by the housing main body 22 and the front board 10. The housing main body 22 is integrally made of resin or the like. The front board 10 is formed separately from the housing main body 22 (see FIG. 5), and attached to the housing main body 22 and the lower housing 20 by a fastener, such as a screw or the like, as will be described later.

The housing main body 22 includes an upper panel 22a arranged facing the lower housing 20 in the up-and-down direction. The upper panel 22a is curved such that the middle portion thereof in the front-back direction is swollen. The housing main body 22 includes, in the front portion thereof, a left front-wall 22b and a right front-wall 22c extending downward from the front edge of the upper panel 22a toward the lower housing 20. The right front-wall 22c is positioned further rearward than the left front-wall 22b. A portion of the right front-wall 22c closer to the left front-wall 22b is moderately curved such that the portion extends diagonally in a direction (right direction (X1 direction) in this example) in the left-right direction and in the reward direction (Y1 direction) from an end of the left front-wall 22b. A media insertion slot 22d, to which portable storage medium, such as an optical disc or the like, are inserted, is formed on the right front-wall 22c.

A plurality of (two in this example) press buttons 3 are arranged in the front board 10 in a row in the left-right direction (X1-X2 direction). The press button 3 may be, e.g., a power button for turning on/off the power of the electronic apparatus 1, or an eject button for ejecting an optical disc from the media insertion slot 22d. The front board 10 is a board like member elongated in the left-right direction and located in front of the right front-wall 22c. In other words, the front board 10 is formed spreading forward (Y2 direction) from the lower edge of the right front-wall 22c and arranged parallel to the bottom surface of the lower housing 20.

As shown in FIG. 6, the front board 10 has an outer panel 7 and a base board (a middle member according to claims) 4 formed separately from the outer panel 7. A circuit board 6 is arranged on the back side (that is, lower side) of the front board 10 and attached to the front board 10, as will be described later.

The outer panel 7 is a thin panel made of, e.g., resin. The outer panel 7 is positioned at the uppermost portion of the front board 10, so that the outer panel 7 forms the outer surface of the electronic apparatus 1. The outer panel 7 is substantially rectangular and elongated in the left-right direction. In this example, one of the four corners of the outer panel 7 is rounded. Specifically, an edge 7d on one side in the left-right direction (an edge on the left side, in this example) is moderately curved, while extending from the front end of the edge 7d to the rear edge 7e of the outer panel 7 along the lower edge of the right front-wall 22c.

The outer panel 7 has two holes 7a formed therein and having a shape corresponding to that of the press button 3. In this example, the press button 3 has a substantially flat disk shape, so that the hole 7a is round. The size of the hole 7a (that is, the diameter of the hole 7a in this example) is slightly larger than that of the upper portion of the press button 3 so that the press button 3 is positioned inside the hole 7a. The press button 3 is a member made of two kinds of materials, that is, a member made through double color molding, so that the press button 3 includes a base portion 3b and a cover portion 3c covering the base portion 3b and exposed at the outer surface of the electronic apparatus 1 (see FIG. 8).

As shown in FIG. 8, the press button 3 is inserted into the hole 7a formed in the outer panel 7 from below. In a state where the press button 3 is not pressed, the surface of the press button 3 and the surface of the outer panel 7 are positioned in substantially the same flat plane. The press button 3 is movable inside the hole 7a in the thickness direction of the outer panel (that is, the up-and-down direction in this example). Specifically, a slight clearance, allowing the press button 3 to move in up-and-down direction, is secured between the press button 3 and the inner edge of the hole 7a. The outer circumferential edge of the press button 3 is formed into a ring shaped flange portion 3a (an edge of the press button according to claims) 3a spreading in the radius direction (see FIG. 7). The flange portion 3a is located under the inner edge of the hole 7a formed in the outer panel 7, so that the press button 3 can be prevented from coming off above from the outer panel 7.

As shown in FIG. 6 to FIG. 8, the base board 4 is disposed on the back side of the outer panel 7. As described above, the circuit board 6 is arranged on the back side of the front board 10. The base board 4 is located between the outer panel 7 and the circuit board 6. The base board 4 is a board like member elongated in the left-right direction. In this example, the base board 4 is a substantially rectangular member having four corners with one thereof being moderately rounded, similar to the outer panel 7. A member thicker than the outer panel 7 serves as the base board 4. In this regard, the base board 4 is made of, e.g., resin, similar to the outer panel 7. The outer panel 7 is attached to the upper surface of the base board 4. For example, the outer panel 7 is attached to the upper surface of the base board 4, using, e.g., adhesive agent or a double-sided sticky tape.

A plurality of (two in this embodiment) holes 4a are formed on the base board 4 in positions corresponding to the respective press buttons 3. The press button 3 is located inside the hole 4a (see FIG. 8). A stopper 41 for restraining movement of the press button 3 is formed on the inner edge of the hole 4a, as will be described later.

The circuit board 6 is located on the back side of the outer panel 7, being arranged along the outer panel 7, that is, in parallel to the outer panel 7. In this example, the base board 4 is arranged between the outer panel 7 and the circuit board 6, as described above. Therefore, the circuit board 6 is located on the back side of the base board 4. A contact member 61 to be pressed by the press button 3 and thereby turned on/off is mounted on the upper surface of the circuit board 6. A tactile switch or the like serves as the contact member 61. As shown in FIG. 8 or 9, a connector 69 is mounted on the lower surface of the circuit board 6. The contact member 61 is electrically connected to another circuit board constituting the electronic apparatus 1, via a cable connected to the connector 69.

The circuit board 6 is attached to the base board 4. In this example, the circuit board 6 is attached to the base board 4 by a plurality of (three, in this example) screws 17. Specifically, as shown in FIG. 6, a plurality of (three here) holes 6a are formed in a row in the left-right direction on the circuit board 6. Meanwhile, a plurality of fixing portions 42 projecting downward are formed on the lower surface of the base board 4 (see FIG. 10). A screw hole 42a is formed in the fixing portion 42, so that a screw 17 inserted into the hole 6a from below is fixed in the screw hole 42a, to thereby attach the circuit board 6 to the base board 4. With the above structure, in a manufacturing process of the electronic apparatus 1, the circuit board 6 and the front board 10 can be handled as a single component.

With the screw 17 fastened, the upper surface of the circuit board 6 is brought into contact with the fixing portion 42. Thus, the distance between the base board 4 and the circuit board 6 is defined by the fixing portion 42. Further, the outer panel 7 is attached to the upper surface of the base board 4, as described above. Thus, relative movement of the outer panel 7, the base board 4, and the circuit board 6 in the thickness direction of the outer panel 7 is restrained.

Further, the base board 4 has a plurality of (two in this example) projections 43*a*, 43*b* formed on the lower surface thereof and projecting downward (see FIG. 9). A relative position of the circuit board 6 relative to the base board 4 is defined by the projections 43*a*, 43*b*. Specifically, a hole 6*b* having an inner diameter identical to the outer diameter of the projection 43*a*, 43*b* and a hole 6*c* longer than the hole 6*b* in the left-right direction are formed on the circuit board 6 (see FIG. 6). With the projections 43*a*, 43*b* fitted in the respective holes 6*b*, 6*c*, the circuit board 6 is arranged in an appropriate position with respect to the base board 4. In this regard, because the hole 6*c* is long in the left-right direction, it is still possible to reliably fit the projection 43*b* in the hole 6*c* even when the holes 6*b*, 6*c* or the projections 43*a*, 43*b* are positioned slightly displaced in the left-right direction from the respective appropriate positions due to tolerance of respective members. Further, because the hole 6*a*, through which the screw 17 passes, is slightly larger in size than the diameter of the screw 17, it is possible to fix the screw 17 to the fixing portion 42 of the base board 4 even when the hole 6*a* is positioned displaced from an appropriate position thereof due to tolerance of respective members.

As shown in FIG. 9 or 10, projections 42*b*, 43*c* projecting downward are formed on the lower surface of the base board 4. Specifically, the projection 42*b* extends from the fixing portion 42 in the left-right direction, whereas the projection 43*c* extends from the projections 43*a*, 43*b* in the front-back direction. The tip ends (that is, lower ends) of the projections 42*b*, 43*c* are positioned at the same height as the tip end of the fixing portion 42. Thus, the tip ends of the projections 42*b*, 43*c* are in contact with the circuit board 6, thereby compensating for instability of the circuit board 6 with respect to the base board 4.

As shown in FIG. 7 or 9, the base board 4 includes a frame 45 formed on the outer circumferential edge thereof. The frame 45 is formed extending from the outer circumferential edge of the base board 4 toward the circuit board 6 and surrounding the outer circumferential edge of the circuit board 6. That is, the circuit board 6 is located inside the frame 45.

A rubber member (elastic member according to claims) 5 for pressing the press button 3 toward the outer panel 7 is disposed between the press button 3 and the circuit board 6. As shown in FIG. 7 or 8, the rubber member 5 includes a disk shaped supporting portion 51, which is located on the back side (that is, lower side) of the press button 3 and supports the press button 3 on the lower side thereof. In this example, the contact member 61 described above is positioned on the back side of the supporting portion 51, and the supporting portion 51 has a projection 51*b* formed on the lower surface thereof. Thus, with the press button 3 pressed down, the projection 51*b* is made to press the contact member 61.

The rubber member 5 is held between the base board 4 and the circuit board 6. In detail, the rubber member 5 includes a substantially ring shaped base portion 52 spreading in the radius direction from the outer circumferential edge of the supporting portion 51 and extending downward toward the circuit board 6. The base portion 52 is located on the lower surface of the base board 4 and sandwiched between the base board 4 and the circuit board 6.

Note that the rubber member 5 keeps pressing the press button 3 toward the outer panel 7 even when the press button 3 is not pressed down. That is, with the circuit board 6, the rubber member 5, the base boat 4, and the outer panel 7 being assembled to one another, the supporting portion 51 is positioned slightly lower than its own position where no external force is applied to the rubber member 5. Thus, the rubber member 5 keeps pressing the press button 3 toward the outer panel 7 by means of elasticity thereof even when the press button 3 is not pressed down.

The base board 4 and the rubber member 5A, respectively, have concave and convex portions formed thereon, the concave and convex portions corresponding to each other and together defining the position of the rubber member 5 relative to the base board 4. In this example, as shown in FIG. 7, a hole 52*a* is formed on the upper surface of the base portion 52 of the rubber member 5, and as shown in FIG. 10, a plurality of (two in this example) projections 44 projecting downward are formed on the lower surface of the base board 4. With the projection 44 fitting in the hole 52*a*, a relative position of the rubber member 5 relative to the base board 4 is defined.

The rubber member 5 and the press button 3 are provided capable of changing relative positions thereof (changing in position in the horizontal direction). Specifically, the lower surface of the press button 3 is not attached to the upper surface of the rubber member 5, so that the press button 3 can move relative to the rubber member 5 in the horizontal direction (that is, parallel to the outer panel 7). This makes it possible to reliably locate the press button 3 inside the hole 7*a* of the outer panel 7 even when the rubber member 5 is displaced from an appropriate position due to a manufacturing error or the like. Accordingly, even small clearance between the inner edge of the hole 7*a* and the press button 3 is sufficiently usable, and the hole 7*a* on the outer panel 7 defines the position of the press button 3. Thus, although the size of the hole 7*a* (the diameter of the hole 7*a*, in this example) is determined so as to be capable of compensating for the tolerance in size of the press button 3 and that of the hole 7*a*, no other tolerance (e.g., an error in attachment position of the outer panel 7 relative to the base board 4, tolerance of the rubber member 5, or the like) besides the tolerance in the sizes of the press button 3 and the hole 7*a* is taken into consideration in determining the size of the hole 7*a*. Meanwhile, the size (the diameter of the hole 4*a*, in this example) of the hole 4*a* formed on the base board 4 is determined so as to be capable of compensating for not only the tolerance in the sizes of the hole 4*a* and the press button 3, but also tolerance in attachment position of the outer panel 7 relative to the base board 4. Thus, the hole 4*a* is larger than the hole 7*a* of the outer panel 7.

The stopper 41 subjected to restriction in positional change in the thickness direction of the outer panel 7 is formed between the press button 3 and the circuit board 6, as described above. With the press button 3 pressed and thereby moved in the thickness direction (that is, moved downward), the stopper 41 is brought into contact with the edge of the press button 3 to thereby restrain the press button 3 from sinking excessively.

In this example, as shown in FIG. 7 or 8, the stopper 41 is formed on the inner edge of the hole 4*a* of the base board 4 and protrudes from the inner edge of the hole 4*a* toward the center of the hole 4*a*. Further, the stopper 41 is formed extending along the circumferential direction of the hole 4*a*, thus having a substantially ring shape in a plan view. The stopper 41 is spaced downward from the outer panel 7, so that a space is formed between the stopper 41 and the outer panel 7. The flange portion 3*a* of the press button 3 is located in the space, and the stopper 41 is located under the flange portion 3*a*. And accordingly, the flange portion 3*a* is allowed to move only between the stopper 41 and the outer panel 7.

In this example, a movement range of the press button 3 tolerated by the stopper 41 is shorter than the distance L2 between the lower surface of the outer panel 7 and the upper surface of the press button 3. That is, the distance L1 between the lower surface of the flange portion 3a and the upper surface of the stopper 41 is shorter than the distance L2 between the lower surface of the outer panel 7 and the upper surface of the press button 3 (that is, the distance between the upper surface of the flange portion 3a and the upper surface of the press button 3). Thus, even when the press button 3 is pressed down until the flange portion 3a hits against the stopper 41, the upper surface of the press button 3 is positioned still higher than the lower surface of the outer panel 7, whereby the press button 3 can be prevented from sinking more than the depth defined by the thickness of the outer panel 7.

The base board 4 and the press button 3, respectively, have a concave and a convex portion formed therein and corresponding to each other so that the base board 4 restrains rotation of the press button 3. In this example, as shown in FIG. 7 or 10, a concave portion 41b is formed on the stopper 41, while a convex portion 3d is formed on the lower surface of the flange portion 3a. With the convex portion 3d fitting in the concave 41b, rotation of the press button 3 is restrained.

As described above, two press buttons 3 are arranged in the front board 10. For preventing one press button 3 from being erroneously inserted into an incorrect hole 4a, a concave portion and a convex portion are formed on the base board 4 and the press button 3, respectively. In detail, as shown in FIG. 10, two convex portions 3e are formed on the lower surface of the flange portion 3a, and the position (position in the circumferential direction of the press button 3) of the convex portion 3e formed on the right press button 3 differs from that of the convex portion 3e formed on the left press button 3. Further, two concaves portions 41c are formed also on the stopper 41 provided to the hole 4a of the base board 4. The concave portion 41c formed on the right hole 4a is positioned corresponding to the convex 3e formed on the right press button 3, and the concave portion 41c formed on the left hole 4a is positioned corresponding to the convex portion 3e formed on the left press button 3. Thus, in an attempt of erroneously inserting the right press button 3 into the left hole 4a, the position of the convex portion 3e does not match with that of the concave portion 41c, so that the press button 3 is prevented from being attached to the base board 4 in such an erroneous manner.

As shown in FIG. 6 or 7, a plurality of LED's (Light Emitting Diode) 68a, 68b, 68c that light in response to an operating state of the electronic apparatus 1 are mounted on the circuit board 6.

As shown in FIG. 7, the LED 68b is arranged adjacent to the contact member 61 and is positioned below the press button 3 and the supporting portion 51 of the rubber member 5. The supporting portion 51 has two holes 51a formed therein, which penetrate the supporting portion 51 in the up-and-down direction. The press button 3 has a maker (not shown) formed thereon, which identifies the press button 3 as a power button or an eject button for ejecting a storage medium. This mark is made of a translucent material through which a light passes, so that the light from the LED 68b is introduced through the hole 51a into the portion made of the translucent material of the press button 3, whereby the mark formed on the press button 3 lights up. In this regard, the LED 68b is surrounded by the ring shaped base portion 52, and the upper surface of the supporting portion 51 located above the LED 68b adhesively contacts the lower surface of the press button 3. With the above structure, the light from the LED 68b is prevented from leaking from a position other than the mark on the press button 3.

As shown in FIG. 7 or 8, the LED 68c is mounted in a position behind the contact member 61. The base board 4 has an hole 4c formed thereon, and a translucent member 19 through which light can pass is fitted in the hole 4c. As the translucent member 19 is located above the LED 68c, the light from the LED 68c is introduced into the translucent member 19, whereby the translucent member 19 lights up. A half mirror serves as the outer panel 7, so that the light, which has passed through the translucent member 19 and the outer panel 7, is discharged to the outside of the electronic apparatus 1. In this regard, the rubber member 5 includes a shielding portion 53 extending in the rearward direction from the base portion 52. The shielding portion 53 has a hole 53a formed thereon and the LED 68c is located inside the hole 53a. With the above structure, the light from the LED 68c is prevented from leaking from a position other than that of the translucent member 19.

As shown in FIG. 6, the LED 68a is located on an end of the circuit board 6. The base board 4 has a hole 4b formed therein and positioned above the LED 68a. The front board 10 includes a thin and long light guiding member 8 extending along the edge of the outer panel 7. The light guiding member 8 is arranged along the edge of the base board 4 with an end thereof being positioned above the hole 4b. Therefore, the light from LED 68a is introduced through the hole 4b into the end of the light guiding member 8. The light having been introduced into the light guiding member 8 proceeds in the extending direction of the light guiding member 8, while being reflected inside the light guiding member 8. While proceeding in the extending direction of the light guiding member 8, the light having passed through the surface of the light guiding member 8 and being discharged forward from the light guiding member 8 illuminates the outer panel 7 and the press button 3.

Figure 11:
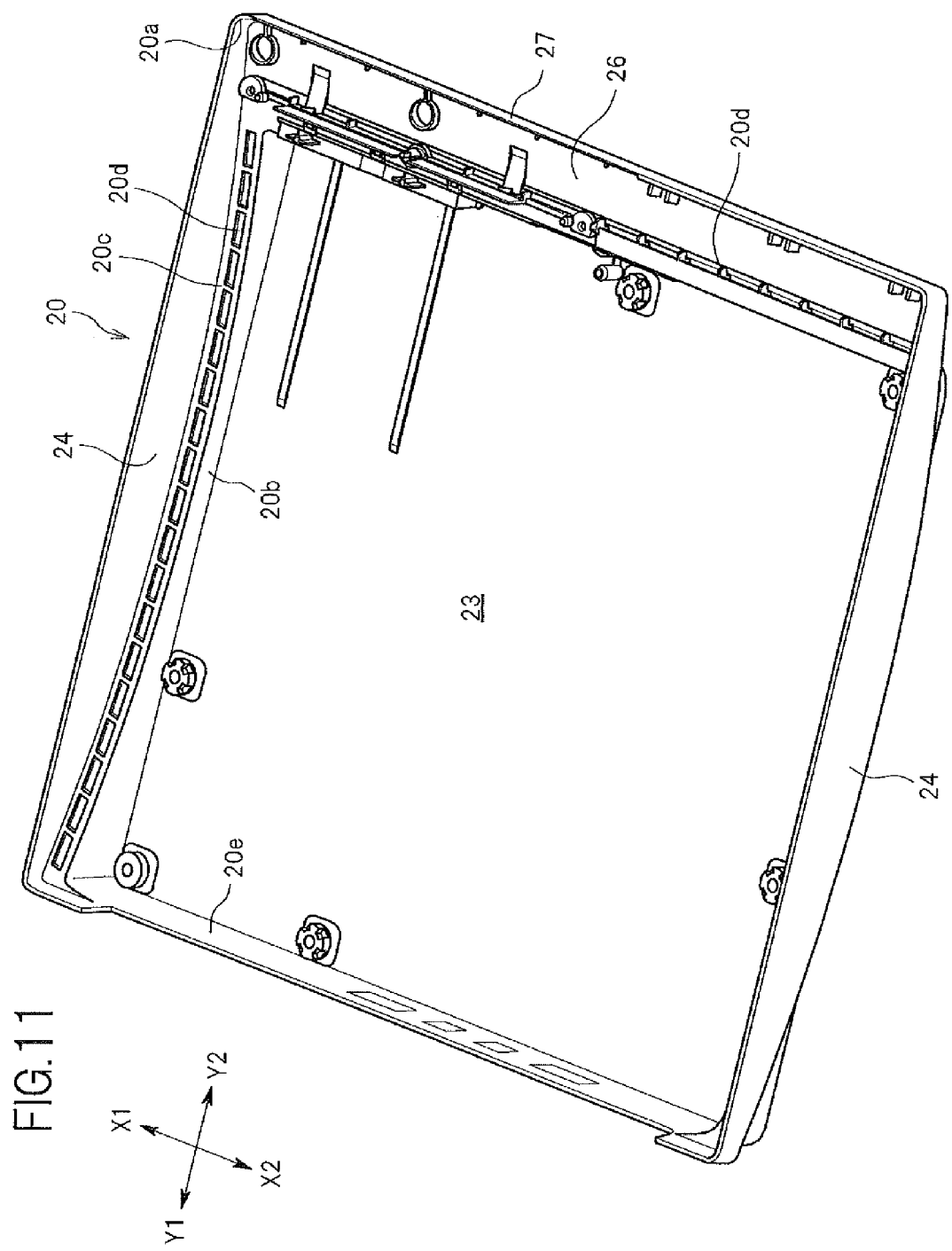
FIG. 11 is a perspective view of a lower housing of the electronic apparatus.
Figure 12:
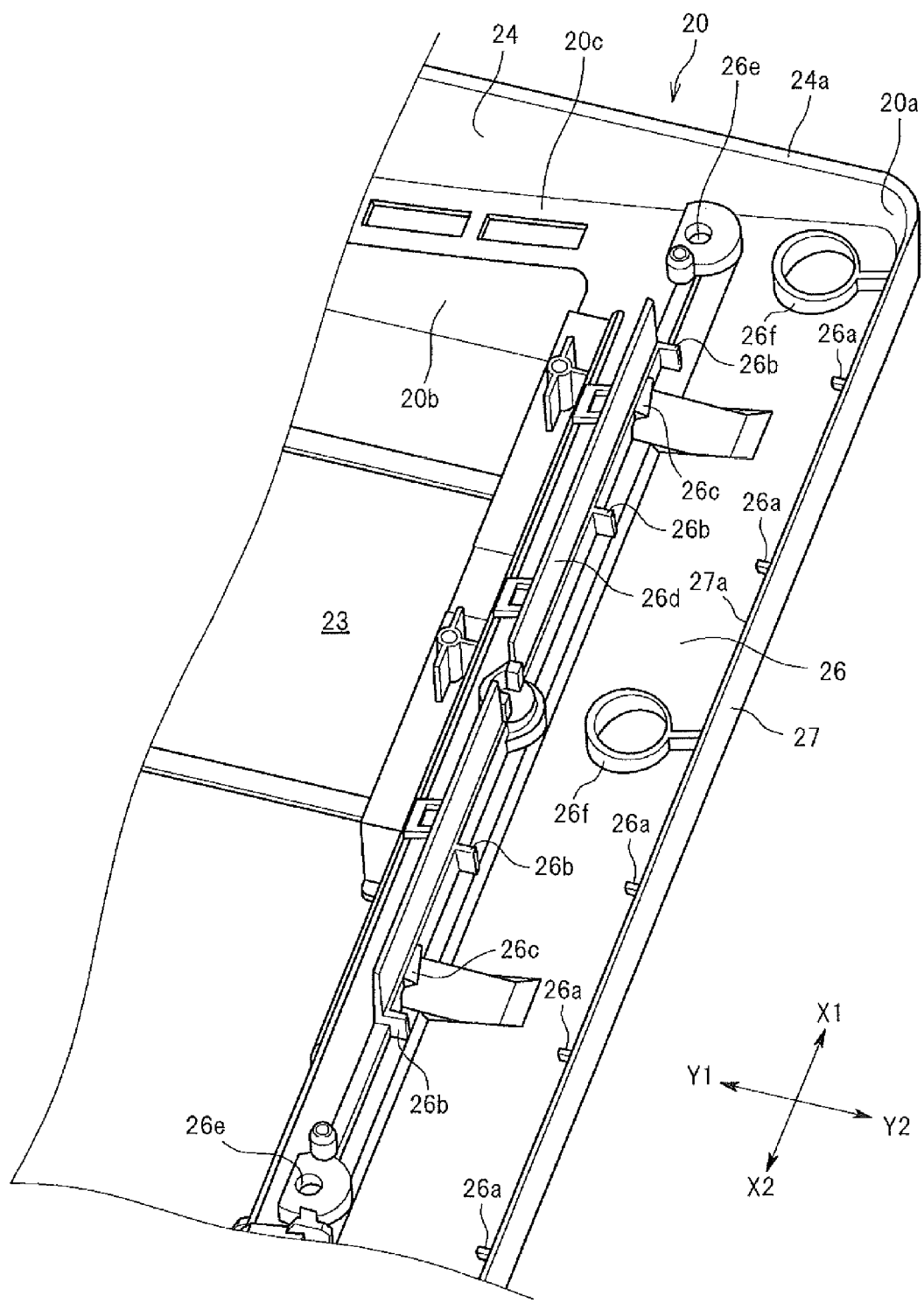
FIG. 12 is an enlarged view of FIG. 11, showing a front portion of the lower housing.
Figure 13:
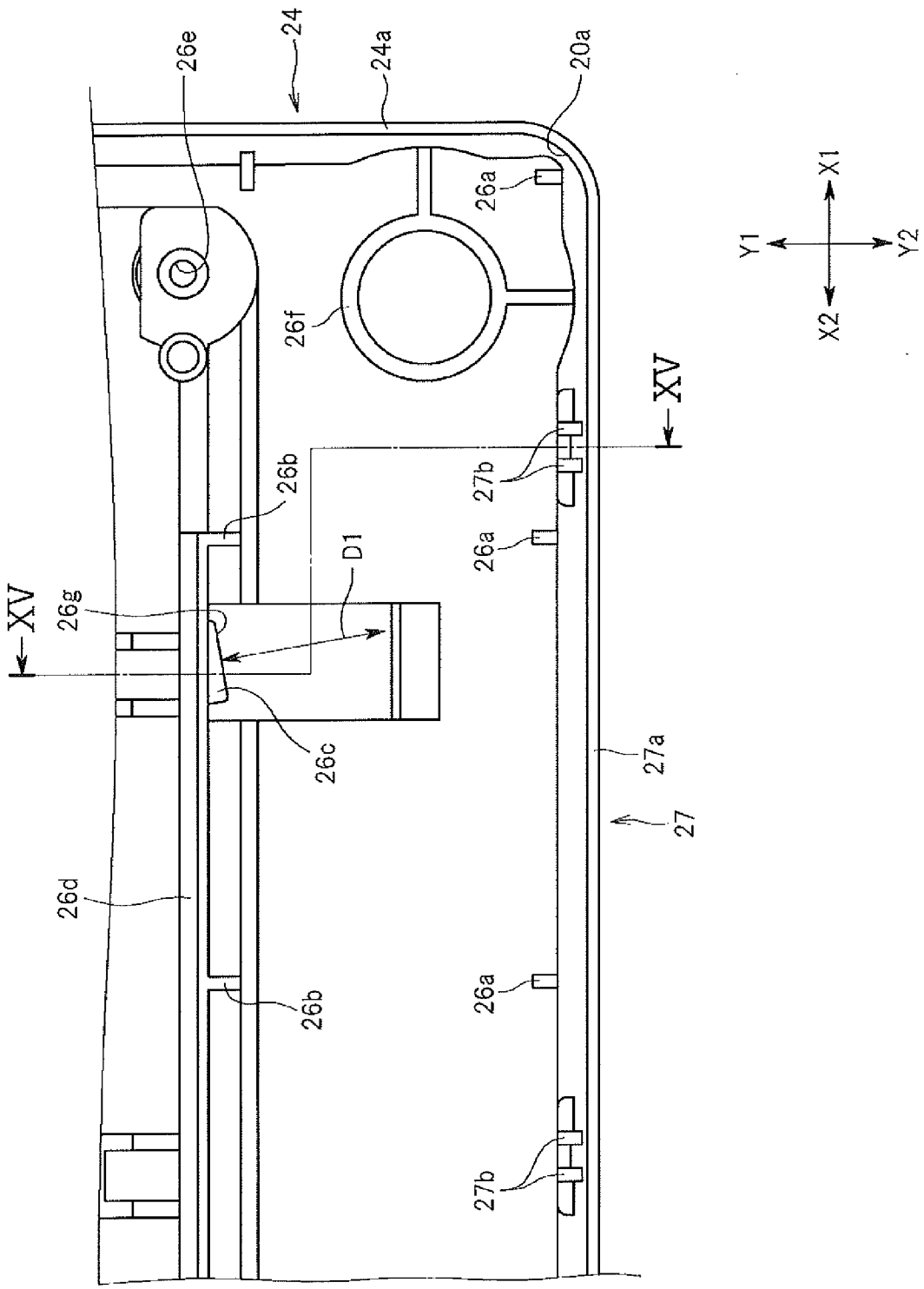
FIG. 13 is a plan view of a front portion of the lower housing.
Figure 14:
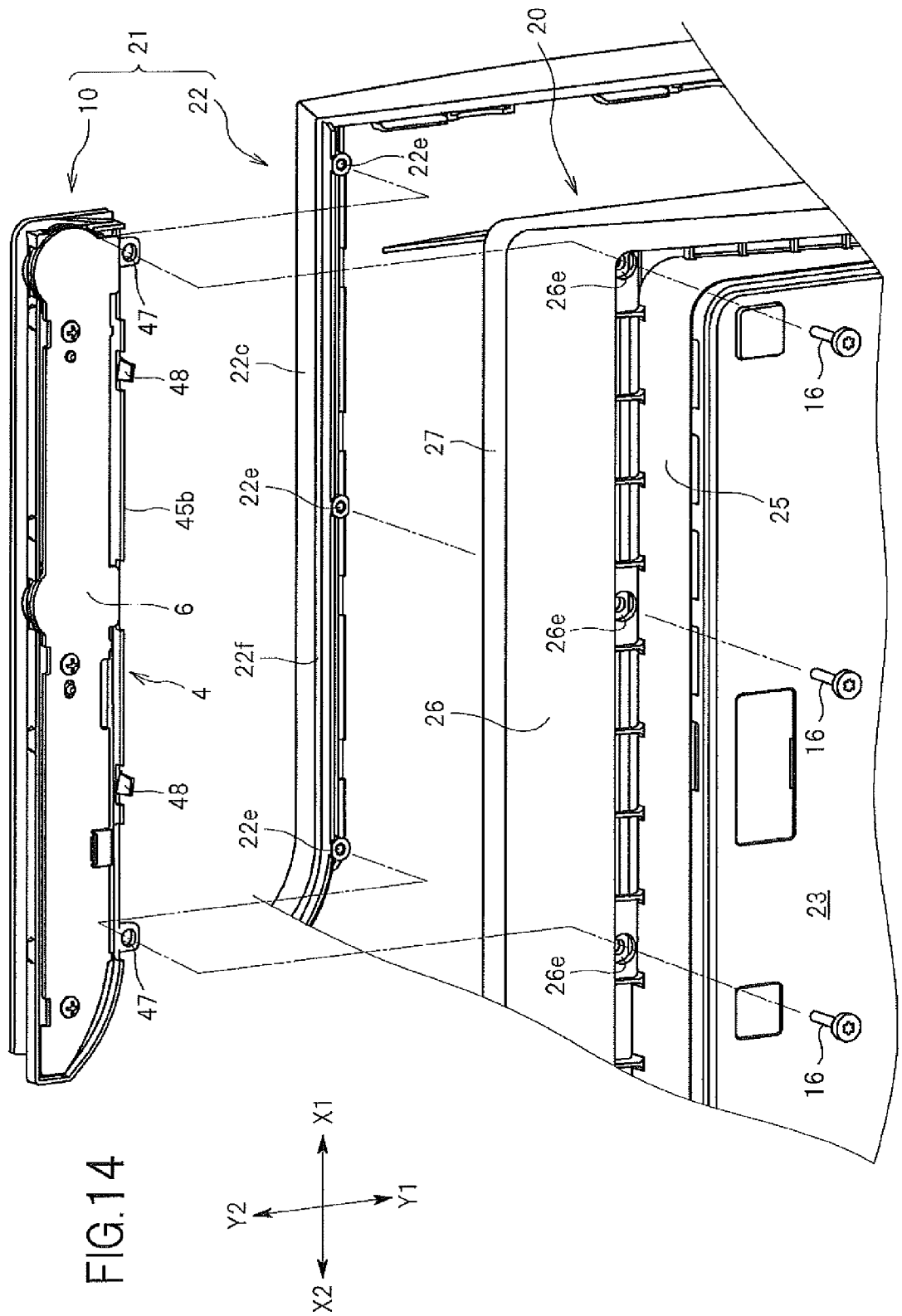
FIG. 14 is an exploded perspective view of the lower housing, the housing main body, and the front board viewed diagonally from below.
Figure 15:
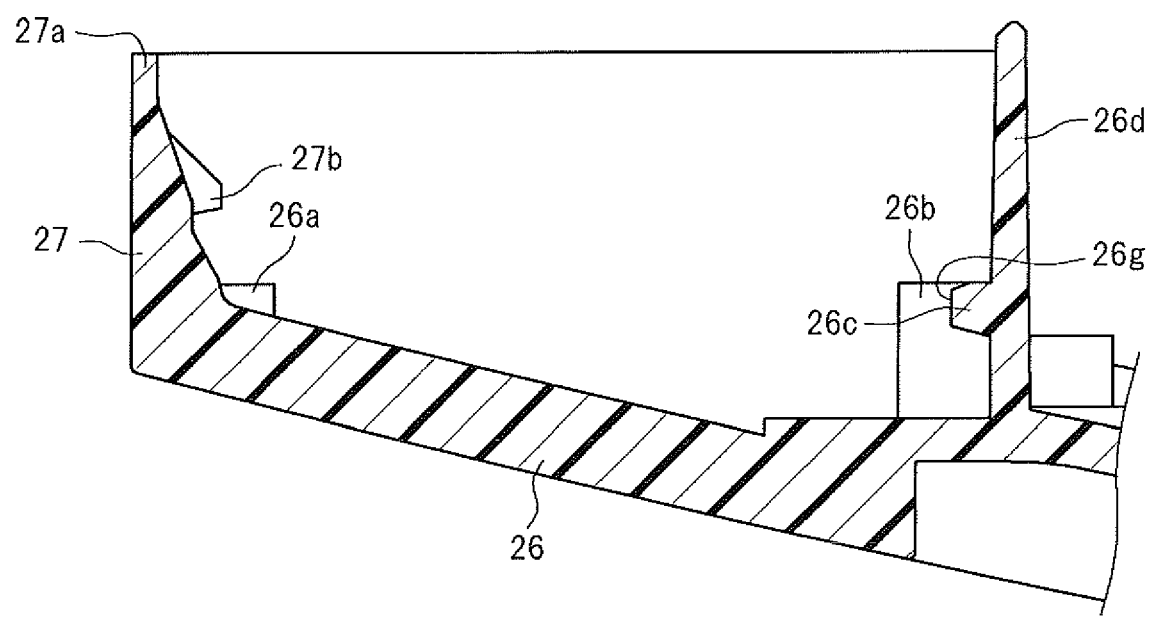
FIG. 15 is a cross sectional view along the line XV-XV in FIG. 13.

In the following, an attachment structure of the front board 10 will be described. FIG. 11 is a perspective view of the lower housing 20. FIG. 12 is an enlarged view of FIG. 11, showing a front portion of the lower housing 20. FIG. 13 is a plan view of the front portion of the lower housing 20; FIG. 14 is an exploded perspective view of the lower housing 20, the housing main body 22, and the front board 10 viewed diagonally from below. FIG. 15 is a cross sectional view along the line XV-XV in FIG. 13. FIG. 16 is a cross sectional view of the lower housing 20 with the front board 10 attached thereto, with the cross section shown being identical to that shown in FIG. 15. FIG. 17 is a perspective view of the front board 10 viewed diagonally from behind.

As shown in FIG. 11, the lower housing 20 includes a square panel shaped bottom 23 forming the bottom of the electronic apparatus 1. As shown in FIG. 14 or 15, the lower housing 20 includes front wall 25 formed on the front portion thereof, which stands upright on the front edge of the bottom 23. As the front portion of the lower housing 20 in this example protrudes further forward than the front wall 25, the lower housing 20 resultantly includes a front bottom 26 spreading further forward from the upper edge of the front wall 25. The lower housing 20 further includes a foremost wall 27 standing upright on the front edge of the front bottom 26. The foremost wall 27 is positioned foremost in the housing 2.

In addition, the lower housing 20 includes a side wall 24 forming a side surface of the electronic apparatus 1. In this example, as shown in FIGS. 2 to 4, the lower housing 20 includes inner side-walls 20b standing upright on the respective left and right edges of the bottom 23. Protruding further leftward and rearward beyond the respective inner side-walls 20b, the lower housing 20 includes side bottoms 20c spreading further sideward from the respective upper edges of the inner side-walls 20b. The side wall 24 stands upright on the edge of the side bottom 20c. The side bottom 20c and the front bottom 26 have inlets 20d formed therein, the inlets 20d being formed along the inner side-wall 20b and the front wall 25, respectively. As shown in FIG. 4, the lower housing 20 includes a rear wall 20e standing upright on the rear edge of the bottom 23, and various connectors 20f are exposed in the rear wall 20e. An outlet 20g is formed on the rear wall 20e. In this regard, the rear wall 20e forms the rearmost surface of the electronic apparatus 1.

As shown in FIG. 16, the front board 10 is disposed on the front portion of the housing 2, facing the front bottom 26 in the up-and-down direction. As described above, the right front-wall 22c of the housing main body 22 is located further rearward than the left front-wall 22b, and an opening is formed between the right front-wall 22c and the upper edge of the lower housing 20. The front board 10 is arranged closing the opening. In this embodiment, the front edge of the front board 10 is located inside the upper edge of the lower housing 20 and extends along the upper edge. In this example, the front edge 7b of the outer panel 7 is positioned further forward than the front edge 4e of the base board 4. Thus, the front edge 7b of the outer panel 7 is brought into contact with the upper edge 27a of the foremost wall 27 from inside. That is, the front edge 7b is in contact with the inner surface of the foremost wall 27, extending along the upper edge 27a in the left-right direction.

In this example, as the front board 10 is disposed inside the corner 20a of the upper edge of the lower housing 20 (see FIG. 12), the edges of the front board 10 extend along both of the upper edge 27a of the foremost wall 27 and the upper edge 24a of the side wall 24 (see FIG. 12). In detail, an edge 7c (the right edge hereinafter) on the one side (right side, in this example) of the right and left sides of the outer panel 7 is positioned further rightward than an edge 4f on the right side (the right edge hereinafter) of the baseboard 4 (see FIG. 6 or 7). Thus, the right edge 7c of the outer panel 7 is brought into contact with the upper edge 24a of the side wall 24 from inside and extends along the upper edge 24a in the front-back direction.

The front board 10 is supported such that the upper surface of the outer panel 7 is located at substantially the same height as the upper edges 27a, 24a of the lower housing 20. In this example, as shown in FIG. 12 or 15, a plurality of supporting portions 26a projecting upward are formed on the front edge of the front bottom 26 of the lower housing 20. The supporting portions 26a are arranged in a row with an interval in the left-right direction at the same height. As shown in FIG. 16, a frame 45 formed on the front edge 4e of the base board 4 (a front frame portion 45a hereinafter) is placed on the supporting portions 26a, so that the front portion of the base board 4 is supported by the supporting portions 26a.

The front bottom 26 has a plurality of supporting portions 26b formed on the rear portion thereof and projecting upward. The supporting portions 26b are also arranged in a row with an interval in the left-right direction at the same height. The frame 45 extending downward from the rear edge of the base board 4 (a rear frame portion 45b hereinafter) is placed on the supporting portions 26b, so that the rear portion of the front board 10 is supported by the supporting portions 26b.

The height of the upper edges 27a, 24a of the lower housing 20 from the respective upper edges of the supporting portions 26a, 26b is the same as the distance from the lower edges of the front frame portion 45a and the rear frame portion 45b to the surface of the outer panel 7. As a result, the surface of the outer panel 7 and the upper edges 27a, 24a of the lower housing 20 are located at substantially the same height.

In this regard, as shown in FIG. 12, in addition to the supporting portions 26a, 26b, a supporting portion 26f projecting upward is formed on the front bottom 26. The supporting portion 26f is positioned under the press button 3 and has a shape corresponding to the press button 3. In this example, the supporting portion 26f has a ring shape. When the press button 3 is pressed, the supporting portion 26f supports the circuit board 6 on the lower side thereof.

The housing 2 has a plurality of pressing portions 26c formed therein, which presses the front board 10 onto the upper edges 27a, 24a of the lower housing 20. In this example, the pressing portion 26c is formed on the lower housing 20. In detail, as shown in FIG. 12, 13, or 15, the front bottom 26 of the lower housing 20 has a wall 26d formed therein and standing upright at a position behind the front board 10. The wall 26d is formed extending along the rear edge of the front board 10, so that the wall 26d and the upper edges 27a, 24a of the lower housing 20 together form a frame inside which the front board 10 is fit. The wall 26d has a plurality of pressing portions 26c formed thereon and projecting forward. Meanwhile, as shown in FIG. 17, the base board 4 has pressed portions 48 formed in the rear frame portion 45b thereof, the pressed portions 48 having a plate shape projecting downward. The pressed portion 48 is formed facing the pressing portion 26c and pressed forward by the pressing portion 26c. In this example, the pressing portion 26c has a front surface 26g facing the pressed portion 48. The front surface 26g is in contact with the lower portion of the pressed portion 48, whereby the pressed portion 48 is pressed forward by a reaction force applied on the pressed portion 48 from the front surface 26g. In other words, the relative position between the pressing portion 26c and the pressed portion 48 is determined such that a reaction force is applied to the pressed portion 48.

In this example, the pressing portion 26c presses the front board 10 diagonally toward the corner 20a formed by the upper edges 27a, 24a of the lower housing 20. In detail, as shown in FIG. 13 or 17, the pressing portion 26c and the pressed portion 48 are formed diagonally with respect to the wall 26d and the rear frame portion 45b, respectively. In this example, the pressing portion 26c has a substantially triangular shape in a plan view of the lower housing 20, so that the distance between the front surface 26g of the pressing portion 26c and the wall 26d becomes shorter toward the side wall 24 of the lower housing 20. The direction perpendicular to the front surface 26g (direction indicated by D1 in FIG. 13) is diagonal to the direction perpendicular to the upper edge 27a of the lower housing 20 (that is, diagonal to the front-back direction (Y1-Y2 direction), in this example). Further, the direction perpendicular to the plate shaped pressed portion 48 (a direction indicated by D1 in FIG. 13) is diagonal to the direction perpendicular to the upper edge 27a of the lower housing 20. Thus, the front surface 26g of the pressing portion 26c directly faces the pressed portion 48. The direction in which the front surface 26g faces the pressed portion 48 is inclined toward the corner 20a. Thus, a force applied on the pressed portion 48 from the pressing portion 26c acts diagonally with respect to the direction perpendicular to the upper edge 27a of the lower housing 20.

The front board 10 is formed so as to be caught by the lower housing 20. In detail, as shown in FIG. 16 or 17, the pressed portion 48 has a convex portion 48a formed on the lower edge of the pressed portion 48 of the front board 10 and projecting toward the wall 26d. The convex portion 48a is located below the pressing portion 26c so that the pressed portion 48 is caught by the pressing portion 26c. Further, as shown in FIGS. 13 to 16, the foremost wall 27 of the lower housing 20 has a plurality of convex portions 27b formed on the inner surface of the foremost wall 27. Meanwhile, the front frame portion 45a of the front board 10 has convex portions 46 formed therein, which project toward the foremost wall 27 (see FIG. 7). This convex position 46 is positioned below the convex 27b of the foremost wall 27 so that the front board 10 is caught by the convex portion 27b and the pressing portion 26c. With the above structure, upward movement of the front board 10 is restrained.

The front board 10 is fixed to both of the housing main body 22 and the lower housing 20 by a pin-like fastener, such as a screw, a bolt, and so forth. In detail, as shown in FIG. 17, a plurality of fixing portions 47 projecting rearward are formed on the rear frame portion 45b of the front board 10. In this example, two fixing portions 47 are provided to the front board 10 and positioned at respective ends of the rear frame portion 45b. The fixing portion 47 has a hole formed therein, which penetrates the fixing portion 47 in the up-and-down direction. As shown in FIG. 14, the front bottom 26 of the lower housing 20 has a plurality of holes 26e formed therein, which penetrate the front bottom 26 in the up-and-down direction. Further, the right front-wall 22c of the housing main body 22 has a plurality of screw holes 22e formed on the lower edge thereof. In this example, on the front bottom 26 and the right front-wall 22c, three holes 26e, 22e are formed in a row in the left-right direction. The left holes 26e, 22e and the right holes 26e, 22e are positioned corresponding to the respective fixing portions 47, and screws 16 are inserted into the respective holes from below. With the above structure, the front board 10 and the housing main body 22 are both fixed to the lower housing 20.

The hole formed in the fixing portion 47 is slightly larger in diameter than the screw 16. Thus, the fixing portion 47 can move slightly relative to the holes 26e, 22e before the screw 16 is fastened. This makes it possible to precisely match the front edge 7b and the right edge 7c of the outer panel 7 to the upper edges 27a, 24a of the lower housing 20 even when the hole of the fixing portion 47 and the holes 26e, 22e are slightly displaced from respective appropriate positions thereof due to tolerance of the respective members.

In this example, no fixing portion 47 is formed in a position corresponding to the middle hole 26e, 22e among the three holes 26e, 22e. Thus, the screw 16 inserted in the middle hole 26e, 22e fixes only the housing main body 22 to the lower housing 20.

As described above, a light guiding member 8 is provided to the rear edge of the front board 10. As shown in FIG. 8 or 16, the upper surface of the light guiding member 8 is located higher than the upper surface of the outer panel 7, so that the light guiding member 8 forms a wall standing upright along the rear edge of the front board 10. The right front-wall 22c of the housing main body 22 is placed on the light guiding member 8. The right front-wall 22c is arranged such that the lower edge 22f thereof is located further forward than the light guiding member 8. Thus, even when a gap is caused between the upper surface of the light guiding member 8 and the lower edge 22f of the right front-wall 22c, the gap does not appear outstanding.

As described above, in the electronic apparatus 1, a stopper 41 is restricted from moving in the thickness direction of the outer panel 7 is formed between the press button 3 and the circuit board 6. When the press button 3 is moved in the thickness direction, the stopper 41 is resultantly brought into contact with the flange portion 3a, that is, the edge of the press button 3.

According to the above described electronic apparatus 1, it is possible to prevent the press button 3 from sinking more than the depth defined by the thickness of the outer panel 7. As a result, the press button 3 can be prevented from being caught by the edge of the hole 7a of the outer panel 7, so that the press button 3 can be operated smoothly.

In the above described electronic apparatus 1, the upper housing 21 includes the front board 10 disposed on the front portion thereof, the front board 10 being defined as a board like member arranged facing the lower housing 20 in the up-and-down direction. The front board 10 is arranged such that the front edge 7b thereof is located along the upper edge 27a of the lower housing 20, the front edge 7b being located inside the upper edge 27a. Further, the pressing portion 26c pressing the front board 10 toward the upper edge 27a of the lower housing 20 is provided to the electronic apparatus 1.

According to the above described electronic apparatus 1, as the front edge 7b of the front board 10 is located inside the upper edge 27a of the lower housing 20, a finger of a user picking up the electronic apparatus 1 can be prevented from being caught by the front edge 7b of the front board 10. Further, as the front board 10 is pressed toward the upper edge 27a by the pressing portion 26c, it is possible to prevent a gap from being caused between the front board 10 and the lower housing 20.

Note that the present invention is not limited to the above described electronic apparatus 1 but is adapted to various modifications.

For example, in the above description, the base board 4 is arranged on the back side of the outer panel 7, and the stopper 41 is formed on the base board 4. However, a member arranged between the outer panel 7 and the circuit board 6 and having the stopper 42 formed thereon may not be a board like member as described above. Alternatively, the stopper 41 may be integrally formed on the outer panel 7, the base board 4 not being arranged between the outer panel 7 and the circuit board 6.

In the above description, the rubber member 5 is disposed between the press button 3 and the circuit board 6, and the press button 3 presses the contact member 61 formed on the circuit board 6, via the rubber member 5. However, the press button 3 may directly press the contact member 61 without the rubber member 5 arranged between the press button 3 and the circuit board 6.

In the above description, the front board 10 is provided only in front of the right front-wall 22c. However, similar to the right front-wall 22c, the left front-wall 22b may be spaced rearward from the upper edge 27a of the foremost wall 27 of the lower housing 20, and the front board 10 may be disposed in front of the right front-wall 22c and the left front-wall 22b.

In the above description, the front board 10 is formed separately from the housing main body 22. However, the front board 10 may be integrally formed on the housing main body 22.

In the above description, the front board 10 has two plate shaped members, namely, the outer panel 7 and the base board 4. However, in an electronic apparatus to achieve the second object described above, the front board 10 may be formed by a single plate member.

In the above description, the press button 3 is formed on the front board 10. However, in an electronic apparatus to achieve the second object described above, the front board 10 may not have such a press button 3. In this electronic apparatus, no circuit board 6 may be arranged on the back side of the front board 10.

In the above description, the pressing portion 26c is formed on the lower housing 20. However, the pressing portion 26c may be formed on, e.g., a chassis disposed inside the housing 2 or on the upper housing 26, or the like.

In the above description, the electronic apparatus 1 includes the light guiding member 8 serving as a wall standing upright along the rear edge of the front board 10, and the right front-wall 22c is disposed on the light guiding member 8. However, instead of the light guiding member 8, the outer panel 7 may include a wall integrally formed with the outer panel 7 and disposed at the rear edge 7e thereof.

What is claimed is:

1. An electronic apparatus comprising:
   an outer panel forming an outer surface of the electronic apparatus and having a hole formed therein;
   a press button fitted inside the hole to form, together with the outer panel, at least a portion of the outer surface of the electronic apparatus, and being capable of moving inside the hole formed in the outer panel in a thickness direction of the outer panel;
   a circuit board disposed on a back side of the outer panel; and
   a stopper formed between the press button and the circuit board, the stopper being restricted from moving in the thickness direction and brought into contact with an edge of the press button when the press button has moved in the thickness direction.

2. The electronic apparatus according to claim 1, further comprising an middle member disposed between the outer panel and the circuit board, the middle member being restricted from moving in the thickness direction of the outer panel and having the stopper formed therein.

3. The electronic apparatus according to claim 2, wherein the outer panel and the circuit board are attached to the middle member.

4. The electronic apparatus according to claim 2, wherein the middle member has a hole formed therein and positioned below the press button, and
   the stopper is formed on an edge of the hole, extending in a circumferential direction of the hole.

5. The electronic apparatus according to claim 1, further comprising an elastic member arranged between the circuit board and the press button and pressing the press button onto the outer panel, wherein the elastic member and the press button are provided capable of being relatively displaced.

6. An electronic apparatus, comprising:
   a lower housing formed opening upward; and
   an upper housing arranged covering the lower housing on the upper side thereof and assembled to the lower housing, wherein
   the upper housing includes a front board in a front portion thereof, the front board being defined as a board like member arranged facing the lower housing in an up-and-down direction,
   the front board is arranged such that a front edge thereof is located along an upper edge of the lower housing, the front edge of the front board being located inside the upper edge of the lower housing, and
   the electronic apparatus further comprises a pressing portion pressing the front board toward the upper edge of the lower housing.

7. The electronic apparatus according to claim 6, wherein the upper housing further includes a housing main body formed covering the lower housing on the upper side thereof and thereby closing the lower housing on the upper side thereof, and
   the front board and the housing main body are separately formed.

8. The electronic apparatus according to claim 6, wherein the pressing portion is formed in the lower housing.

9. The electronic apparatus according to claim 6, wherein the front board is disposed inside a corner of the upper edge of the lower housing, and
   a direction in which the pressing portion presses the front board inclines toward the corner.

10. The electronic apparatus according to claim 7, wherein the front board has a wall provided to a rear edge of the front board,
    the housing main body includes a front wall formed on a front portion thereof, the front wall being positioned on the wall formed on the front board, and
    the front wall of the housing main body is arranged such that a lower edge thereof is located further forward than the wall of the front board.

* * * * *